United States Patent
Yamauchi

(10) Patent No.: US 9,214,469 B2
(45) Date of Patent: Dec. 15, 2015

(54) SEMICONDUCTOR MEMORY CIRCUIT AND DEVICE

(71) Applicant: Sharp Kabushiki Kaisha, Osaka-shi, Osaka (JP)

(72) Inventor: Yoshimitsu Yamauchi, Osaka (JP)

(73) Assignee: Sharp Kabushiki Kaisha Osaka, Osaka (JP)

( * ) Notice: Subject to any disclaimer, the term of this patent is extended or adjusted under 35 U.S.C. 154(b) by 0 days.

(21) Appl. No.: 14/371,202

(22) PCT Filed: Dec. 28, 2012

(86) PCT No.: PCT/JP2012/084025
§ 371 (c)(1),
(2) Date: Jul. 9, 2014

(87) PCT Pub. No.: WO2013/105460
PCT Pub. Date: Jul. 18, 2013

(65) Prior Publication Data
US 2015/0003165 A1    Jan. 1, 2015

(30) Foreign Application Priority Data
Jan. 12, 2012  (JP) ................................. 2012-003712

(51) Int. Cl.
*G11C 16/10* (2006.01)
*H01L 27/115* (2006.01)
*G11C 11/405* (2006.01)
(Continued)

(52) U.S. Cl.
CPC ........ *H01L 27/11517* (2013.01); *G11C 11/403* (2013.01); *G11C 11/405* (2013.01); *G11C 16/0408* (2013.01); *H01L 27/11521* (2013.01);
(Continued)

(58) Field of Classification Search
CPC ................................ G11C 16/10; G11C 16/26
USPC ........................................ 365/185.18, 185.24
See application file for complete search history.

(56) References Cited

U.S. PATENT DOCUMENTS

2001/0040820 A1*  11/2001  Forbes et al. ............ 365/185.03
2009/0173934 A1*  7/2009  Jain ................................ 257/20

OTHER PUBLICATIONS

Official Communication issued in International Patent Application No. PCT/JP2012/084025, mailed on Apr. 16, 2013.
(Continued)

*Primary Examiner* — Michael Tran
(74) *Attorney, Agent, or Firm* — Keating & Bennett, LLP

(57) ABSTRACT

Provided is a semiconductor memory circuit including an oxide semiconductor insulated gate FET enabling advanced performance without being affected by a variation in threshold voltage. A semiconductor memory circuit MC includes a first transistor element T1 composed of an insulated gate FET having a gate electrode connected to a memory node N1, a drain electrode connected to an intermediate node N2, and a source electrode connected to a data I/O terminal DIO; a second transistor element T2 composed of an oxide semiconductor insulated gate FET having a gate electrode connected to a first control terminal CIN1, a drain electrode connected to the intermediate node N2, and a source electrode connected to the memory node N1; a capacitive element C1 having one end connected to a first voltage terminal VIN1 and the other end connected to the memory node N1; and a switching element S1 for controlling a conducting state between a second control terminal CIN2 or a second voltage terminal VIN2 or the first voltage terminal VIN1, and the intermediate node N2, based on a voltage level of at least the second control terminal CIN2.

14 Claims, 15 Drawing Sheets

(51) Int. Cl.
*G11C 11/403* (2006.01)
*G11C 16/04* (2006.01)
*H01L 27/12* (2006.01)

(52) U.S. Cl.
CPC .............. *G11C 16/10* (2013.01); *H01L 27/1156* (2013.01); *H01L 27/1225* (2013.01)

(56) References Cited

OTHER PUBLICATIONS

Matsuzaki et al., "1Mb Non-Volatile Random Access Memory Using Oxide Semiconductor", Memory Workshop (IMW), 3rd IEEE International, May 2011, 4 pages.

* cited by examiner

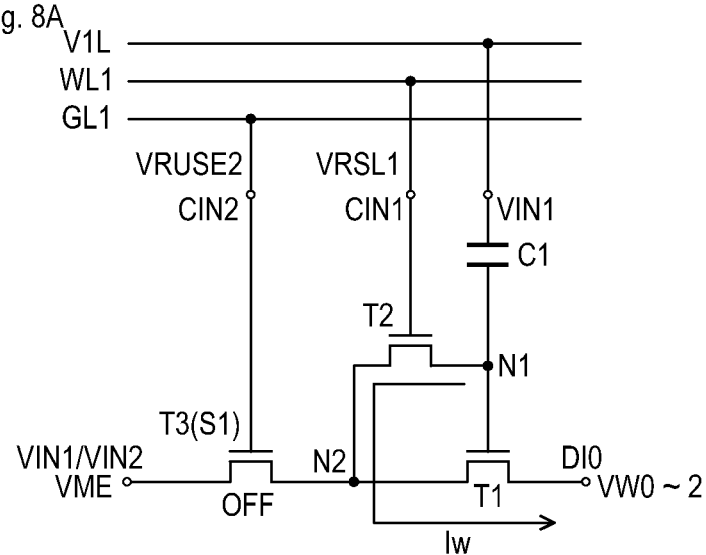
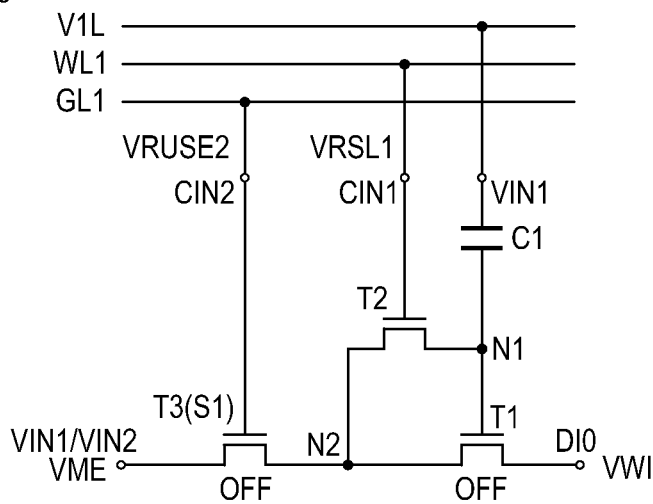
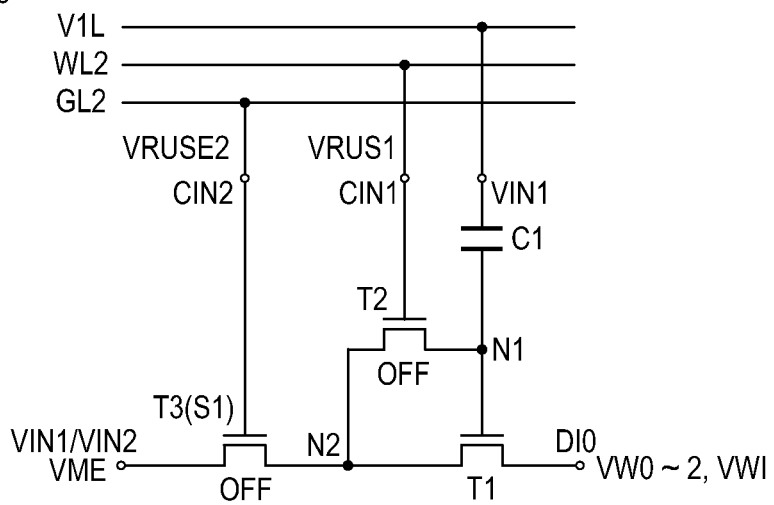

SEMICONDUCTOR MEMORY CIRCUIT AND DEVICE

CROSS-REFERENCE TO RELATED APPLICATIONS

This application is a National Phase filing under 35 U.S.C. §371 of International Application No. PCT/JP2012/084025 filed on Dec. 28, 2012, and which claims priority to Japanese Patent Application No. 2012-003712 filed on Jan. 12, 2012.

TECHNICAL FIELD

The present invention relates to a semiconductor memory circuit including an oxide semiconductor insulated gate FET (Field Effect Transistor), and a semiconductor memory device including the semiconductor memory circuit, and more particularly, to a semiconductor memory circuit and device suitable for storing multilevel information.

BACKGROUND ART

The semiconductor memory device is broadly divided into a RAM (Random Access Memory) and a ROM (Read Only Memory). As for the RAM, there is no limit on the number of writing operations, but it has the problem that retained data is lost at the time of power-supply disconnection, so that high power consumption is needed for retaining data during a standby period. Meanwhile, as for the ROM, data can be retained at the time of power-supply disconnection, but there is a limit on the number of writing operations, so that it cannot be used for a case where the writing operations are frequently needed. Therefore, research and development have been carried out for an ideal NVRAM (Nonvolatile Random Access Memory) through the ages because there is no limit on the number of writing operations and written data can be retained with super-low power consumption, but it has not been commercialized yet.

As for the insulated gate FET such as a MOSFET formed of oxide semiconductor having higher bandgap energy than silicon, it is expected that a leak current can be extremely small compared to a silicon MOSFET, so that development of the NVRAM using the oxide semiconductor MOSFET has been reported in Non Patent Document 1 described below.

As shown in FIG. 15, a memory cell disclosed in Non Patent Document 1 includes an ordinal silicon MOSFET 30, a capacitive element 31 having one end connected to a gate FN of the silicon MOSFET 30, and an oxide semiconductor MOSFET 32 in which one of a source and a drain is connected to the gate FN. The silicon MOSFET 30 and the capacitive element 31 simulatively form a silicon MOSFET (memory element) having a stacked gate structure formed of a floating gate and a control gate, and used in a memory cell in a conventional flash memory. According to the conventional flash memory, a charge is transferred from or to the floating gate through a thin gate insulating film by hot electron injection or FN tunneling, while according to the memory cell having the circuit configuration shown in FIG. 15, a charge is transferred through the oxide semiconductor MOSFET 32. As a result, it is not necessary to generate a high electric filed to transfer the charge from or to the floating gate FN, so that data can be written at low voltage and high speed, and there is no limit on the number of writing operations. In addition, a leak current of the oxide semiconductor MOSFET 32 is extremely small, so that the charge stored in the floating gate FN can be retained stably for a long time.

Prior Art Document
Non Patent Document
  Non Patent Document 1: Takanori Matsuzaki, et al., "1 Mb Non-Volatile Random Access Memory Using Oxide Semiconductor", Memory Workshop (IMW), 2011 3rd IEEE International, May 2011.

SUMMARY OF THE INVENTION

Problems to be Solved by the Invention

The memory cell described in Non Patent Document 1 is totally the same as the conventional flash memory cell in that information is stored by controlling a threshold voltage of the floating-gate MOSFET (memory element) formed of the silicon MOSFET 30 and the capacitive element 31 in which the other end of the capacitive element 31 serves as a control gate, based on an amount of the charges stored in the floating gate FN. Therefore, when there is a variation in the threshold voltage of the silicon MOSFET 30 itself among the memory cells, there is a variation in the threshold voltage of the memory element even when the memory cell has the same amount of charges stored in the floating gate FN, which causes a defect such as a reduction in operation margin. In addition, when the variation in the threshold voltage is great, it is necessary to prevent the threshold voltage from varying in a case where multilevel information having three or more values is stored in the one memory cell. In order to eliminate the variation in the threshold voltage with respect to the circuit, the conventional flash memory uses a method in which the charge is injected to the floating gate FN by stages, it is verified whether or not appropriate charge storing state is provided each time, and the charge is injected by the memory cell unit until the appropriate charge storing state is achieved. However, when the above writing method is employed in the NVRAM, a writing time is extremely longer than a reading time, which is the problem.

The present invention was made in view of the above problems, and it is an object of the present invention to provide a semiconductor memory circuit including an oxide semiconductor insulated gate FET capable of enlarging an operation margin, reducing an operation voltage, and implementing advanced performance such as an increase in level of stored information without being affected by a variation in threshold voltage, and a semiconductor memory device including the semiconductor memory circuit.

Means for Solving the Problem

In order to attain the above object, as first characteristics, the present invention provides a semiconductor memory circuit comprising a first transistor element composed of an insulated gate FET having a gate electrode connected to a memory node, a drain electrode connected to an intermediate node, and a source electrode connected to a data I/O terminal; a second transistor element composed of an oxide semiconductor insulated gate FET having a gate electrode connected to a first control terminal, a drain electrode connected to the intermediate node, and a source electrode connected to the memory node; a capacitive element having one end connected to a first voltage terminal, and the other end connected to the memory node; and a switching element for controlling a conducting state between one of a second control terminal, a second voltage terminal, and the first voltage terminal, and the intermediate node, based on a voltage level of at least the second control terminal.

Furthermore, in the semiconductor memory circuit having the first characteristics, it is preferable that the switching element is one of a third transistor element composed of an insulated gate FET having a gate electrode connected to the second control terminal, a drain electrode connected to one of the second voltage terminal and the first voltage terminal, and a source electrode connected to the intermediate node; a fourth transistor element composed of an insulated gate FET having a gate electrode and a drain electrode each connected to the second control terminal, and a source electrode connected to the intermediate node; and a diode element in which one of an anode terminal and a cathode terminal is connected to the second control terminal, and the other is connected to the intermediate node.

Furthermore, it is preferable that each of the first to third transistor elements is a thin film transistor element.

Furthermore, in the semiconductor memory circuit having the first characteristics, it is preferable that an oxide semiconductor forming the second transistor element is InGaZnO.

Furthermore, in the semiconductor memory circuit having the first characteristics, as second characteristics, in a writing operation, the second transistor element is turned on and the switching element is set to a non-conducting state, based on each of voltage levels of the first control terminal and the second control terminal, and a memory voltage having a constant relationship with a writing voltage inputted to the data I/O terminal is written in the memory node.

In addition, in the semiconductor memory circuit having the second characteristics, as third characteristics, in an initialization operation prior to the writing operation, the second transistor element is turned on and the switching element is set to a conducting state, based on each of the voltage levels of the first control terminal and the second control terminal, and a voltage level of the memory node is initialized.

Furthermore, in the semiconductor memory circuit having the second or third characteristics, as fourth characteristics, after the writing operation, the second transistor element is turned off and the memory node is set to a floating state, based on the voltage level of the first control terminal, and the memory voltage stored in the memory node is kept retained.

Furthermore, in the semiconductor memory circuit having any one of the first to fourth characteristics, as fifth characteristics, in a reading operation, the second transistor element is turned off based on the voltage level of the first control terminal, and a reading control voltage is applied to the second control terminal, and one of a reading voltage and a reading current corresponding to the memory voltage stored in the memory node is outputted to the data I/O terminal.

Furthermore, in order to attain the above object, as first characteristics, the present invention provides a semiconductor memory device including a memory cell array in which a plurality of memory cells are arranged in each of a row direction and a column direction, each of the memory cells configured by the semiconductor memory circuit having any one of the above characteristics, in which the first control terminal of the semiconductor memory circuit arranged in the same row is connected to a common first control signal line, the second control terminal of the semiconductor memory circuit arranged in the same row is connected to a common second control signal line, the data I/O terminal of the semiconductor memory circuit arranged in the same column is connected to a common data signal line, and the first voltage terminal of the semiconductor memory circuit arranged in the same row or the same column is connected to a common fixed voltage line.

Furthermore, the semiconductor memory device having the first characteristics comprises, as second characteristics, a data signal line drive circuit for driving the data signal line individually; a first control signal line drive circuit for driving the first control signal line individually; a second control signal line drive circuit for driving the second control signal line individually; and a reading circuit for detecting one of a reading voltage and a reading current outputted to the data signal line based on the memory voltage stored in the memory node.

Furthermore, in the semiconductor memory device having the second characteristics, as third characteristics, in a writing operation, the data signal line drive circuit individually applies a writing voltage based on data to be stored, to the data signal line in a selected column serving as a writing target, and individually applies a writing inhibition voltage to the data signal line in an unselected column serving as a non-writing target to turn off the first transistor element in a case where the second transistor element is in an on state in the semiconductor memory circuit arranged in the unselected column.

Furthermore, in the semiconductor memory device having the second or third characteristics, as fourth characteristics, in the writing operation and an initialization operation performed prior to the writing operation, the first control signal line drive circuit applies a first selected row voltage to the first control signal line in a selected row serving as an operation target to turn on the second transistor element, and applies a first unselected row voltage to the first control signal line in an unselected row serving as a non-operation target to turn off the second transistor element, and in a reading operation, the first control signal line drive circuit applies a first reading row voltage to the first control signal lines in all of the rows to turn off the second transistor element.

Furthermore, in the semiconductor memory device having any one of the second to fourth characteristics, as fifth characteristics, in the writing operation, the second control signal line drive circuit applies a second writing row voltage to the second control signal lines in all of the rows to set the switching element to a non-conducting state, in the initialization operation prior to the writing operation, the second control signal line drive circuit applies a second initialization selected row voltage to the second control signal line at least in the selected row serving as the operation target to set the switching element to a conducting state, and in the reading operation, the second control signal line drive circuit applies a second reading selected row voltage to the second control signal line in the selected row serving as the operation target to set the switching element to the conducting state, and applies a second reading unselected row voltage to the second control signal line in the unselected row serving as the non-operation target to set the switching element to the non-conducting state.

Furthermore, in order to attain the above object, as sixth characteristics, the present invention provides a semiconductor memory device including a memory cell array in which a plurality of memory cells are arranged in each of a row direction and a column direction, each of the memory cells configured by the semiconductor memory circuit having any one of the above characteristics, in which the first control terminal of the semiconductor memory circuit arranged in the same row is connected to a common first control signal line, the second control terminal of the semiconductor memory circuit arranged in the same column is connected to a common second control signal line, the data I/O terminal of the semiconductor memory circuit arranged in the same column is connected to a common data signal line, the first voltage terminal of the semiconductor memory circuit arranged in the same row is connected to a common first voltage control line, and the switching element of the semiconductor memory circuit is a third transistor element composed of an insulated gate FET having a gate electrode connected to the second control terminal, a drain electrode connected to the second voltage terminal, and a source electrode connected to the intermediate node.

Furthermore, the semiconductor memory device having the sixth characteristics includes, as seventh characteristics, a data signal line drive circuit for driving the data signal line individually; a first control signal line drive circuit for driving the first control signal line individually; a second control signal line drive circuit for driving the second control signal line individually; a first voltage control line drive circuit for driving the first voltage control line individually; and a reading circuit for detecting one of a reading voltage and a reading current outputted to the data signal line based on the memory voltage stored in the memory node.

Effect of the Invention

According to the semiconductor memory circuit having the above characteristics, the memory voltage having the constant relationship with the writing voltage inputted to the data I/O terminal is stored in the memory node. More specifically, when the second transistor element is turned on and the switching element is set to be the conducting state to initialize the memory node at the predetermined initialization voltage, and then the switching element is set to be the non-conducting state, the drain electrode and the gate electrode of the first transistor element are connected through the second transistor element, so that the first transistor element serves as a diode. In a case where a conductivity type of the first transistor element is an n type, the diode is provided such that an anode is connected to the memory node, and a cathode is connected to the data I/O terminal, while in a case where the conductivity type of the first transistor element is a p type, the diode is provided such that an anode is connected to the data I/O terminal, and a cathode is connected to the memory node. In either case, a turn-on voltage of the diode is equal to an absolute value of a threshold voltage of the first transistor element. Therefore, the initialization voltage is previously set such that the voltage difference between the initialization voltage and the writing voltage of the memory node is larger than the turn-on voltage of the diode regardless of the writing voltage. Accordingly, the data I/O terminal is driven at the writing voltage during the writing operation, and when the diode is in the turned-on state, the voltage of the memory node drops from the initialization voltage to the writing voltage until the diode is turned off in the case where the conductivity type of the first transistor element is the n type, and whereas the voltage of the memory node rises from the initialization voltage to the writing voltage until the diode is turned off in the case where the conductivity type is the p type. As a result, in the writing operation, the memory voltage having the specific relationship with the writing voltage is stored in the memory node, that is, in the case where the conductivity type of the first transistor element is the n type, the memory voltage is higher than the writing voltage by the threshold voltage of the first transistor element and in the case where the conductivity type of the first transistor element is the p type, the memory voltage is lower than the writing voltage by the threshold voltage of the first transistor element. Therefore, in the initialization operation and the writing operation, the memory voltage having the specific relationship with the writing voltage is stored in the memory node only by switching the conduction/non-conduction of the switching element.

After the memory voltage is stored in the memory node, the memory node is set to a floating state by turning off the second transistor element also, so that the charge corresponding to the memory voltage can be continuously retained. Here, since the second transistor element is the oxide semiconductor transistor enabling the extremely small leak current compared to the silicon transistor, the charge corresponding to the memory voltage stored in the memory node can be retained stably for a long time, and power consumption regarding the data retention can be considerably reduced, so that a function as a nonvolatile memory can be provided.

Furthermore, in the reading operation, the switching element is set to be the conducting state, so that a current flows to the data I/O terminal through the switching element and the first transistor element, and the reading voltage or the reading current corresponding to the memory voltage stored in the memory node can be outputted to the data I/O terminal.

In the reading operation to output the reading voltage to the data I/O terminal, the data I/O terminal is previously set to the floating state so that the voltage level can be changed when the data I/O terminal is charged or discharged with the reading current flowing between the drain electrode and the source electrode of the first transistor element. Thus, when the voltage of the data I/O terminal is charged or discharged to the same voltage level as the writing voltage in the writing operation, the voltage difference between the gate electrode (memory node) and the source electrode (data I/O terminal) of the first transistor element becomes equal to an absolute value of the threshold voltage of the first transistor element, so that the first transistor element cuts off, and the charging or discharging ends, and as a result, the reading voltage having the same voltage as the writing voltage is outputted to the data I/O terminal.

Furthermore, in the reading operation to output the reading current to the data I/O terminal, a bias condition of the intermediate node is adjusted so that the first transistor element reaches a saturation state in the reading operation, so that the reading current flowing between the drain electrode and the source electrode of the first transistor element can be a saturation current which is proportional to a square of the voltage difference between the voltage across the gate electrode and the source electrode, and the threshold voltage of the first transistor element. Here, the memory voltage stored in the memory node is the voltage which differs from the writing voltage applied in the writing operation by the absolute value of the threshold voltage of the first transistor element, so that the reading current is the current which is proportional to a square of a voltage difference between the writing voltage and the voltage applied to the data I/O terminal in the reading operation. Thus, it is possible to output the reading current corresponding to the writing voltage, that is, the reading current corresponding to the information stored in the memory node.

Here, it is to be noted that since the memory voltage stored in the memory node is the voltage higher or lower by the threshold voltage of the first transistor element in each semiconductor memory circuit, the variation in the threshold voltage of the first transistor element has been previously compensated, so that the reading voltage and the reading current outputted to the data I/O terminal in the reading operation do not contain a voltage component and a current component depending on the threshold voltage of the first transistor element, and are not affected by the threshold voltage of the first transistor element. As a result, according to the semiconductor memory circuit having the above characteristics, it is possible to reduce a voltage difference among the writing voltages corresponding to the respective values of the multilevel information, so that the operation can be performed at lower voltage, or the multilevel information can be promoted when the operation is performed at the same voltage.

In the case where each transistor element forming the semiconductor memory circuit having the above characteristics is composed of the thin film transistor (TFT), the semiconductor memory circuit having the above characteristics can be arranged on a panel of an active matrix type display panel including the TFT in a pixel. More specifically, it is possible to individually form the semiconductor memory circuit having the above characteristics as a memory circuit in each pixel and use the circuit in storing a pixel voltage in each pixel, or it is possible to arrange the semiconductor memory circuits each having the above characteristics in the shape of a matrix and position the circuits in a periphery part of a pixel array as a memory cell array to retain various data.

Furthermore, in the case where each transistor element forming the semiconductor memory circuit having the above characteristics is composed of the thin film transistor (TFT), a semiconductor memory device can be formed by laminating the element on an upper layer side of a logic circuit such as a CPU (central processing unit) or the like formed on a silicon substrate. That is, it is not necessary to separately provide a region to form the semiconductor memory device, on the semiconductor substrate having the logic circuit, so that is possible to form the semiconductor memory device three-dimensionally, on an existing logic circuit LSI.

According to the semiconductor memory device having the above characteristics, since the semiconductor memory circuit having the above characteristics is used, the same operational advantage can be provided, and further in the memory cell array having the semiconductor memory circuits arranged in the row direction and the column direction, it is possible to select the specific memory cell in the memory cell array by controlling voltage states of the first control single line, the second control signal line, and the data signal line and partially write and read the information.

BRIEF DESCRIPTION OF THE DRAWINGS

FIGS. 8A to 8C are circuit diagrams showing states of the transistor elements in the memory cells in the selected row and the unselected row in the writing operation.

EMBODIMENTS FOR CARRYING OUT THE INVENTION

Hereinafter, each embodiment of a semiconductor memory circuit and a semiconductor memory device according to the present invention will be described with reference to the drawings.

First Embodiment

In the first embodiment, a description will be given to a semiconductor memory device (hereinafter, referred to as the "memory device" simply) according to the present invention, and a circuit configuration of a semiconductor memory circuit (hereinafter, referred to as the "memory cell" simply) according to the present invention, serving as a memory cell used in the memory device.

Figure 1A:
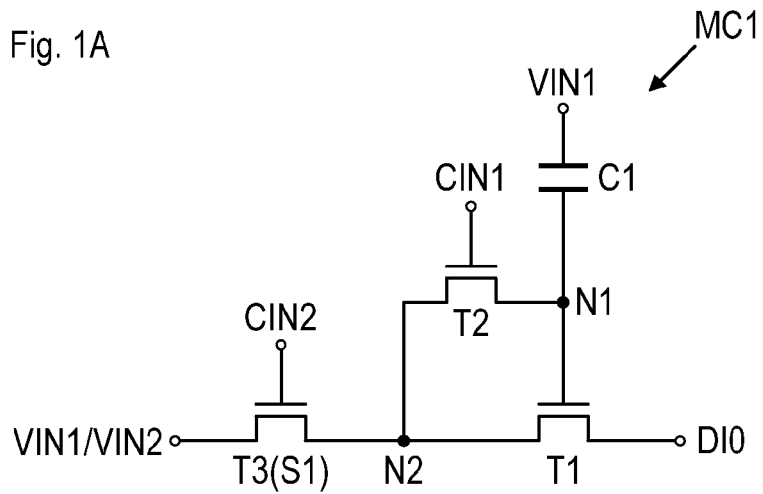
FIGS. 1A to 1C are equivalent circuit diagrams each showing a circuit configuration example of a semiconductor memory circuit according to the present invention.
Figure 1B:
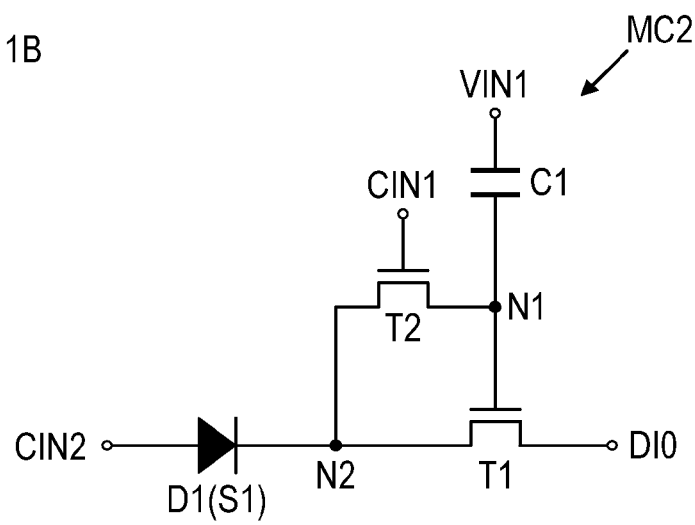

FIGS. 1A and 1B are equivalent circuit diagrams showing two kinds of memory cells MC. Each of the memory cells MC is provided with a first transistor element T1 composed of an insulated gate FET, a second transistor element T2 composed of an oxide semiconductor insulated gate FET, a capacitive element C1, and a switching element S1. In this embodiment, it is assumed that each of the first and second transistor elements T1 and T2 is an n-channel thin film transistor (TFT).

Figure 1C:
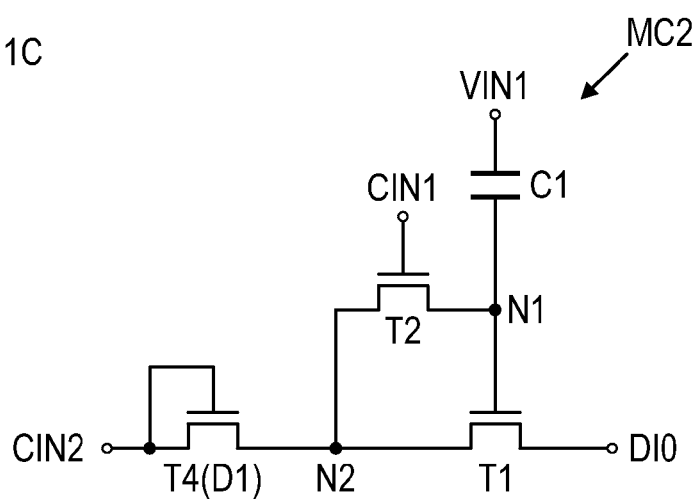

In addition, as shown in FIGS. 1A-1C, in each memory cell MC, a gate electrode of the first transistor element T1, a source electrode of the second transistor element T2, and one end of the capacitive element C1 are connected to one another to form a memory node N1, a drain electrode of the first transistor element T1, a drain electrode of the second transistor element T2, and one end of the switching element S1 are connected to one another to form an intermediate node N2, a source electrode of the first transistor element T1 is connected to a data I/O terminal DIO, a gate electrode of the second transistor element T2 is connected to a first control terminal CIN1, and the other end of the capacitive element C1 is connected to a first voltage terminal VIN1. The memory cells MC are different from each other, with regard to a specific configuration of the switching element S1.

According to the first type memory cell MC1 shown in FIG. 1A, the switching element S1 is formed of a third transistor element T3 composed of the insulating gate FET having the same structure and conductivity type as those of the first transistor element T1, in which a drain electrode is connected to the first voltage terminal VIN1 or another second voltage terminal VIN2, a gate electrode is connected to a second control terminal CIN2, and a source electrode is connected to the intermediate node N2. The third transistor element T3 can control conduction/non-conduction between the first voltage terminal VIN1 or the second voltage terminal VIN2 and the intermediate node N2, based on a voltage level of the second control terminal CIN2. In the case where the drain electrode of the third transistor element T3 is connected to the second voltage terminal VIN2, voltage levels of the first voltage terminal VIN1 and the second voltage terminal VIN2 can be separately set. In this case, since the first voltage terminal VIN1 is connected only to the other end of the capacitive element C1, the voltage level of the first voltage terminal VIN1 can be set to any fixed voltage (such as a ground voltage). However, in the case where the drain electrode of the third transistor element T3 is connected to the first voltage terminal VIN1, the voltage level of the first voltage terminal VIN1 is set to a voltage which is suitable for an initialization operation and a reading operation of the memory cell MC1 as will be described below.

According to the second type memory cell MC2 shown in FIG. 1B, the switching element S1 is formed of a diode D1 in which an anode is connected to the second control terminal CIN2, and a cathode is connected to the intermediate node N2. In addition, the diode D1 takes various specific shapes such as diode elements including a p-n junction diode using p-n junction of a semiconductor forming the first transistor element T1, and a pin diode using a pin structure of that semiconductor, and a diode circuit formed of a fourth transistor element T4 composed of an insulated gate FET having the same structure and conductivity type as those of the first transistor element T1, in which a drain electrode and a gate electrode are both connected to the second control terminal CIN2, and its source electrode is connected to the intermediate node N2 as shown in FIG. 1C. The diode D1 can control an electrical connection between the second control terminal CIN2 and the intermediate node N2, based on the voltage level of the second control terminal CIN2. When a voltage difference between the second control terminal CIN2 and the intermediate node N2 exceeds a turn-on voltage of the diode D1, the diode D1 becomes a conducting state, and a current flows from the second control terminal CIN2 to the intermediate node N2. In addition, the turn-on voltage of the diode D1 shown in FIG. 1C is a threshold voltage of the fourth transistor element T4.

Each memory cell MC shown in FIGS. 1A-1C is different in specific configuration of the switching element S1, but since the memory cell MC has the same basic function in which the electrical connection of the switching element S1 is controlled based on the voltage level of the second control terminal CIN2, the function of each memory cell MC as a memory circuit is the same.

Figure 2:
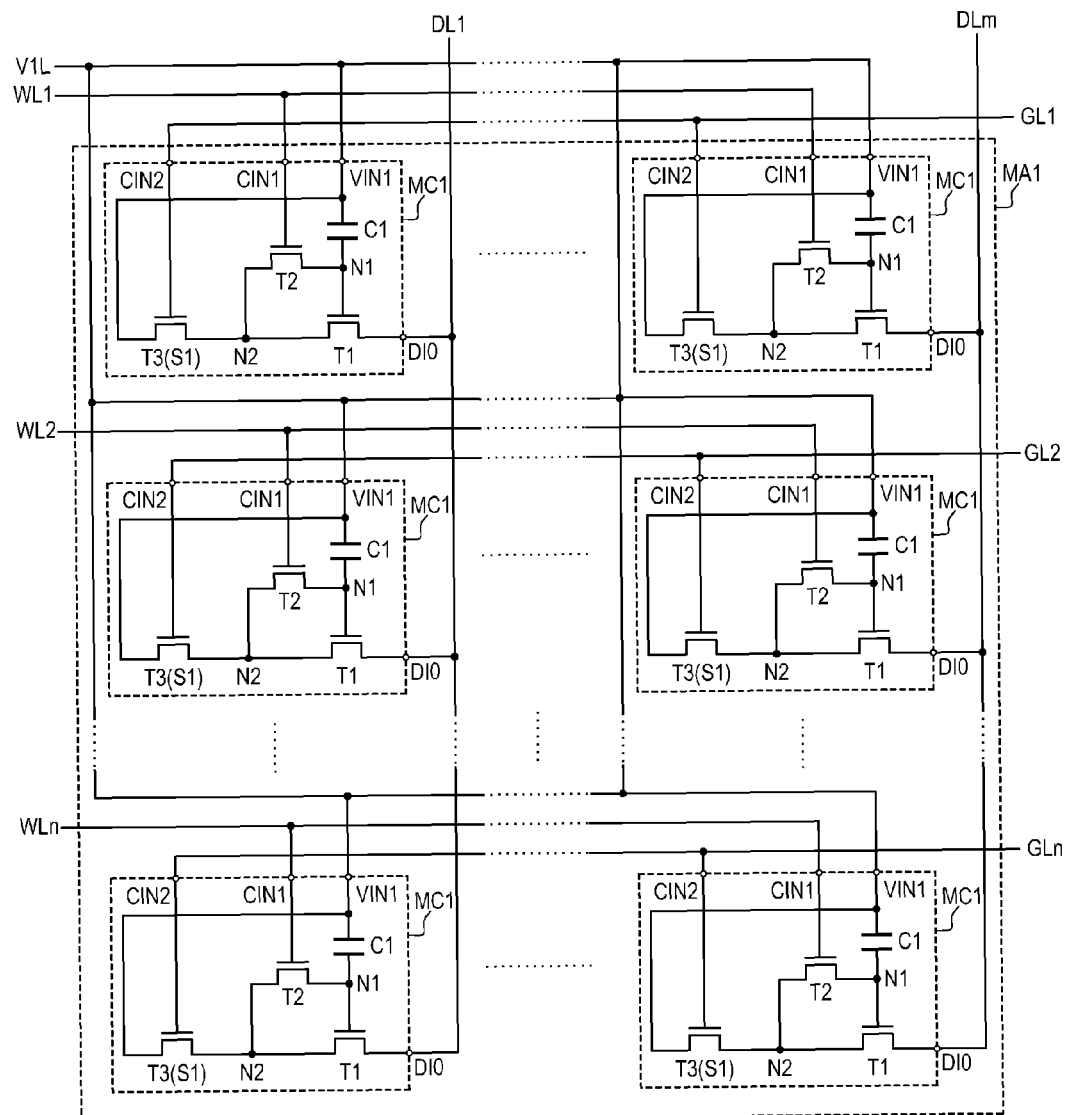
FIG. 2 is an equivalent circuit diagram showing one circuit configuration example of a memory cell array formed of a first type memory cell shown in FIG. 1A.
Figure 3:
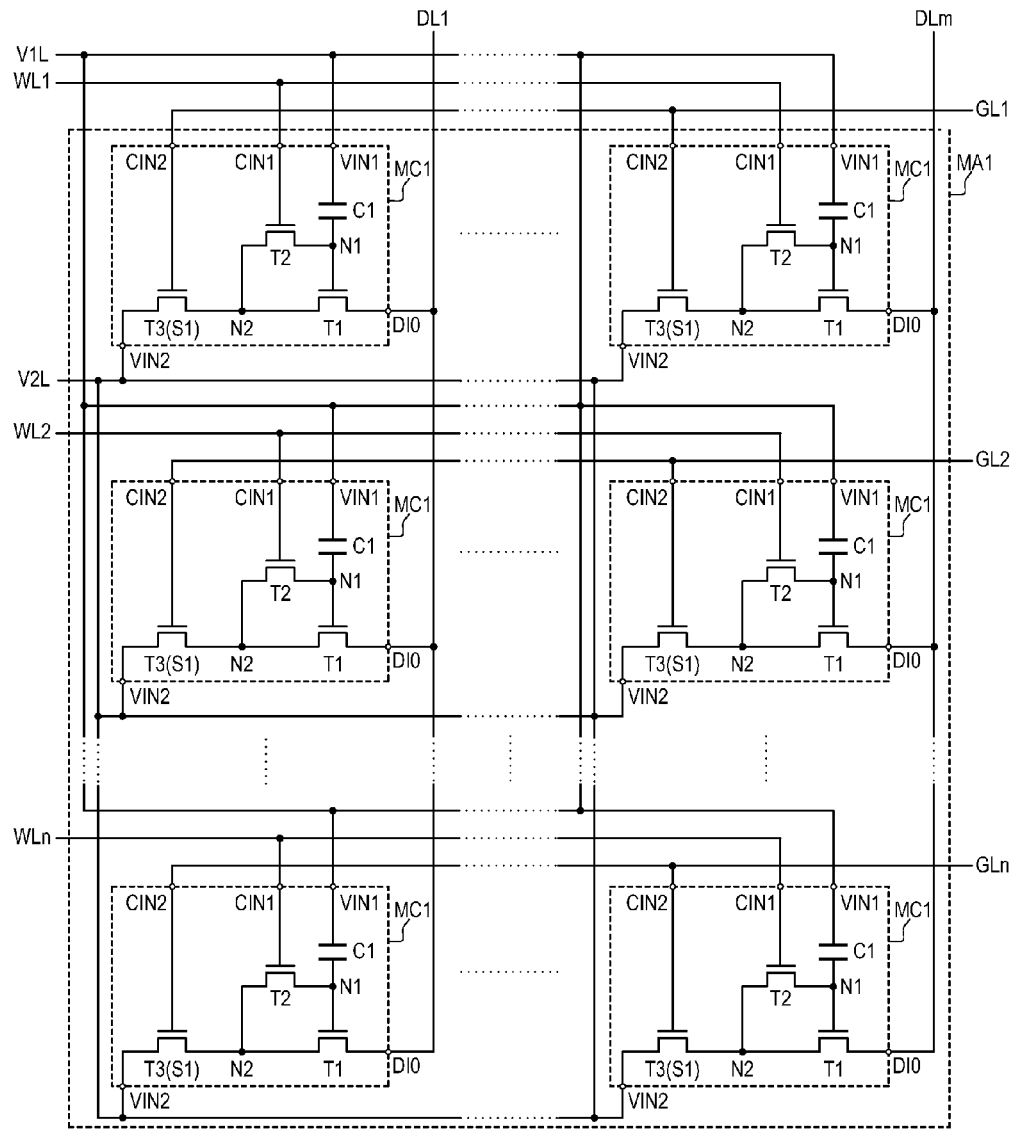
FIG. 3 is an equivalent circuit diagram showing another circuit configuration example of a memory cell array formed of the first type memory cell shown in FIG. 1A.
Figure 4:
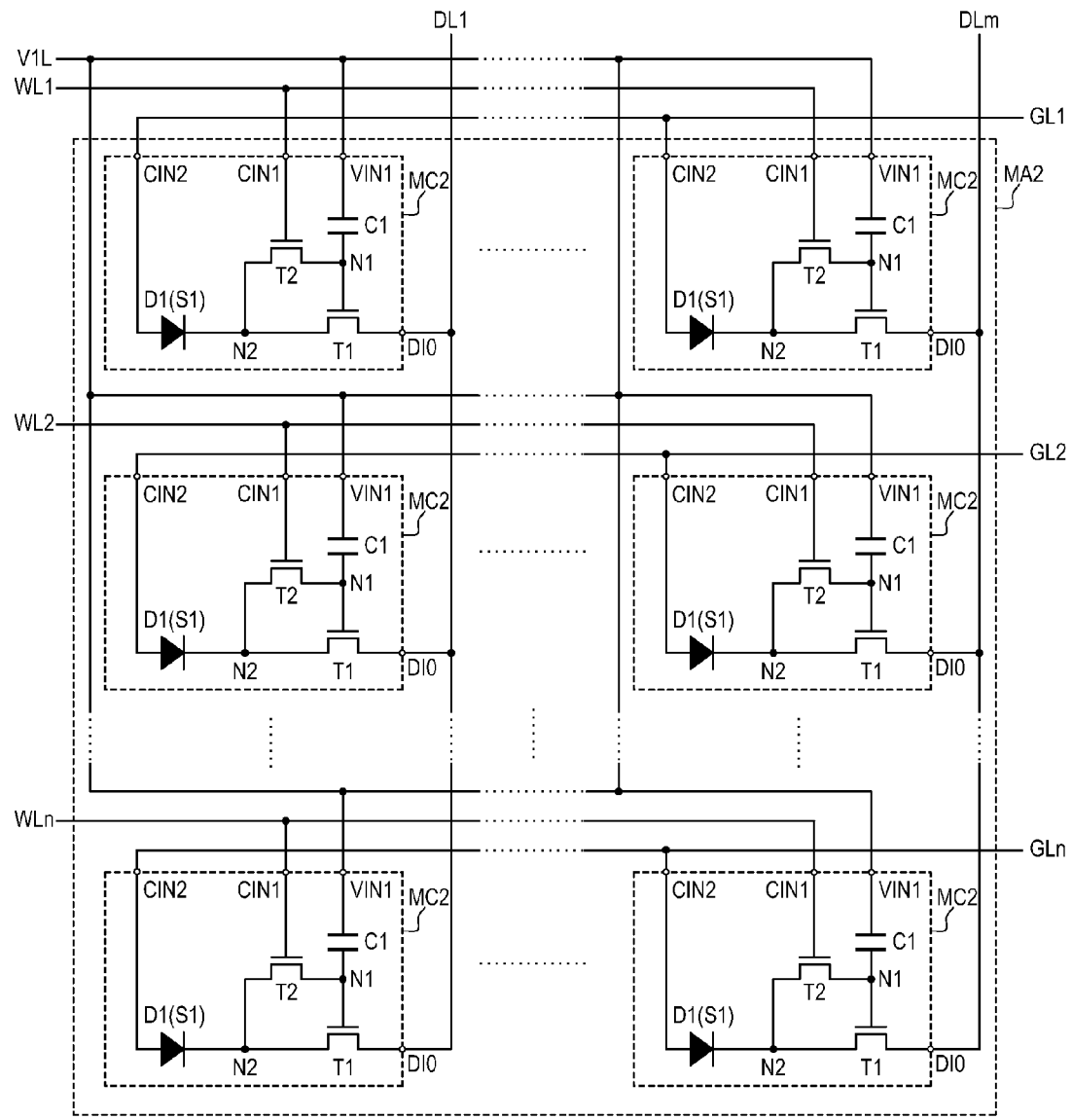
FIG. 4 is an equivalent circuit diagram showing one circuit configuration example of a memory cell array formed of a second type memory cell shown in FIG. 1B.

FIGS. 2 and 3 each shows an equivalent circuit diagram of a first type memory cell array MA1 in which a plurality of the first type memory cells MC1 shown in FIG. 1A are arranged in a row direction and a column direction. FIG. 2 shows a case where the memory cell MC1 does not have the second voltage terminal VIN2, and the drain electrode of the third transistor element T3 is connected to the first voltage terminal VIN1, and FIG. 3 shows a case where the drain electrode of the third transistor element T3 is connected to the second voltage terminal VIN2. FIG. 4 shows an equivalent circuit diagram of a second type memory cell array MA2 in which a plurality of the second type memory cells MC2 shown in FIG. 1B are arranged in a row direction and a column direction. In FIGS. 2 to 4, an X direction and a Y direction shown in the drawings are defined as the row direction and the column direction, respectively, for the sake of description. Each of the memory cell arrays MA1 and MA2 includes m data lines (DL1, DL2, . . . , DLm) extending in the column direction, n first word lines (WL1, WL2, . . . , WLn) extending in the row direction, n second word lines (GL1, GL2, . . . , GLn) extending in the row direction, and a first fixed voltage line V1L. As shown in FIG. 3, in the case where the memory cell MC1 includes the second voltage terminal VIN2, the memory cell array MA1 further includes a second fixed voltage line V2L. Here, m and n each represents a natural number of 2 or more. In addition, the first and second type memory cell arrays MA1 and MA2 are collectively referred to as the memory cell array MA.

Furthermore, for the sake of description, the data lines (DL1, DL2, . . . , DLm) are collectively referred to as the data line DL, the first word lines (WL1, WL2, . . . , WLn) are collectively referred to as the first word line WL, and the second word lines (GL1, GL2, . . . , GLn) are collectively referred to as the second word line GL. Here, the data line DL corresponds to a "data signal line", and the first word line WL corresponds to a "first control signal line", and the second word line GL corresponds to a "second control signal line".

As shown in FIGS. 2 to 4, the data I/O terminals DIO of the memory cell MC arranged in the same column is connected to the common data line DL, the first control terminal CIN1 of the memory cell MC arranged in the same row is connected to the common first word line WL, the second control terminal CIN2 of the memory cell MC arranged in the same row is connected to the common second word line GL, and the first voltage terminal VIN1 of the memory cell MC arranged in the same row or the same column is connected to the common first fixed voltage line V1L. In addition, as shown in FIG. 3, in the case where the memory cell MC1 includes the second voltage terminal VIN2, the second voltage terminal VIN2 of the memory cell MC arranged in the same row or the same column is connected to the common second fixed voltage line V2L.

Figure 5:
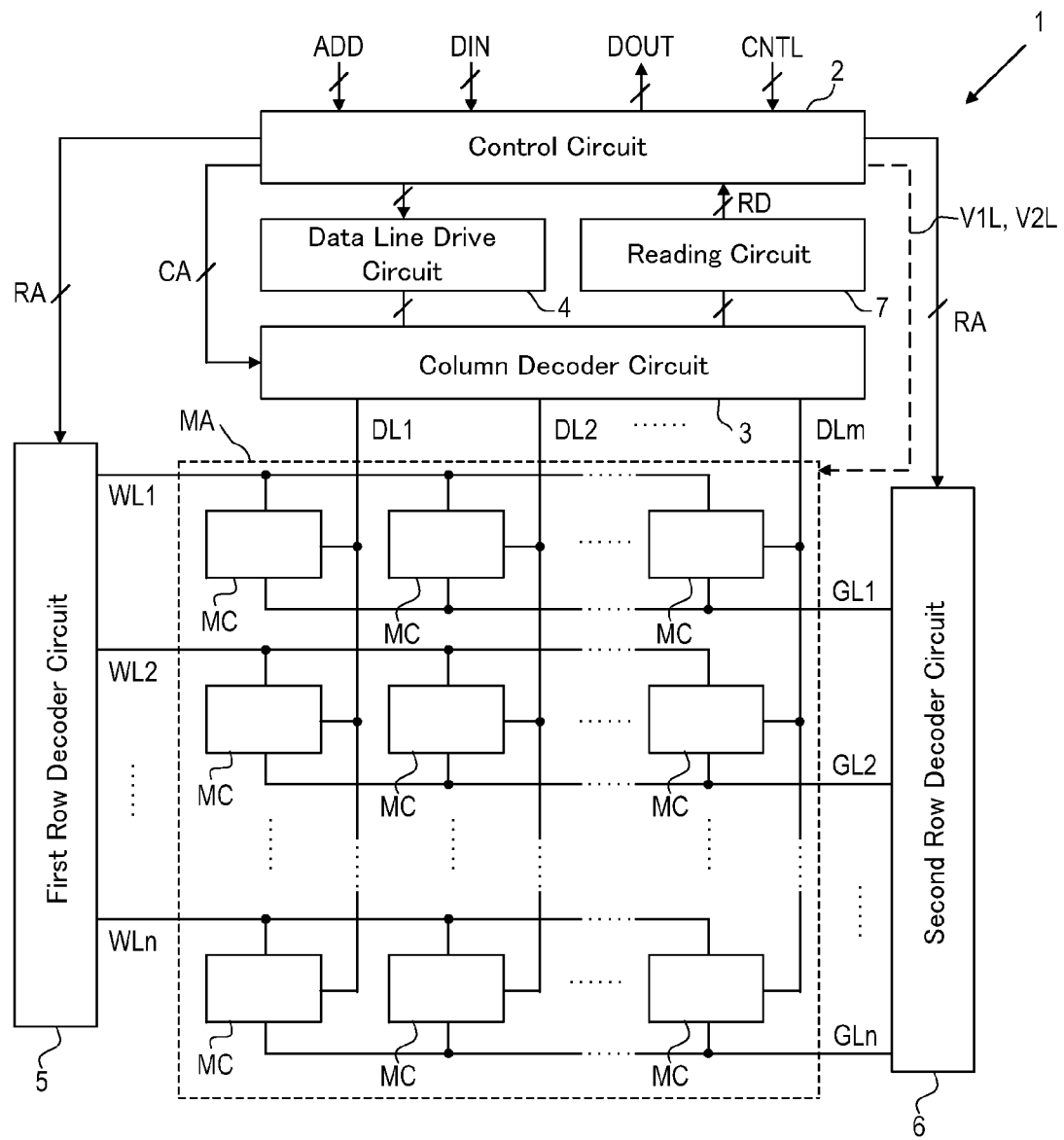
FIG. 5 is a block diagram showing one example of a schematic configuration of a semiconductor memory device according to the present invention.

FIG. 5 is a schematic block configuration diagram showing one configuration example of a memory device 1 having the memory cell array MA. According to this embodiment, the memory device 1 is provided with a control circuit 2, a column decoder circuit 3, a data line drive circuit 4, a first row decoder circuit 5, a second row decoder circuit 6, and a reading circuit 7. The data line drive circuit 4, the first row decoder circuit 5, and the second row decoder circuit 6 correspond to a "data signal line drive circuit", a "first control signal line drive circuit", and a "second control signal line drive circuit", respectively.

The control circuit 2 communicates an address signal ADD, a data input signal DIN, a data output signal DOUT, a control signal CNTL for controlling various memory operations such as writing, initialization, and reading operations which will be described below, with an outside of the memory device 1; creates a column address signal CA for selecting the data line DL serving as a writing or reading target and supplies the created column address signal CA to the column decoder circuit 3; creates a row address signal RA for selecting the first word line WL and the second word line GL serving as the writing or reading target and supplies the created row address signal RA to the first row decoder circuit 5 and the second row decoder circuit 6; gives an instruction to apply a writing voltage VW corresponding to the data input signal DIN to the selected data line DL; and converts information RD detected by the reading circuit 7 to the data output signal DOUT to output it. Furthermore, the control circuit 2 controls the various memory operations, which will be described below, based on the externally inputted control signal CNTL. In addition, the control circuit 2 supplies a predetermined fixed voltage to each of the fixed voltage line V1L and the second fixed voltage line V2L when the memory cell array MA is the memory cell array MA1 shown in FIG. 3, and supplies a predetermined fixed voltage to the first fixed voltage line V1L when the memory cell array MA is the memory cell array MA1 shown in FIG. 2. It is not necessary to supply the fixed voltage when the memory cell array MA is the memory cell array MA2 shown in FIG. 4. As described above, the control circuit 2 serves as a comprehensive circuit including an address input buffer, data I/O circuit, control signal input buffer, control circuit for the memory operations, and the like, in a general semiconductor memory circuit, and the control circuit 2 can be implemented based on a circuit configuration of a well-known semiconductor memory circuit, and the specific circuit configuration of the control circuit 2 is not a main object of the present invention, so that the detailed description is omitted.

The column decoder circuit 3 is a circuit for selecting the data line DL serving as the writing operation target and the reading operation target, based on the column address signal CA. In the writing operation, the writing voltage VW corresponding to input data is applied from the data line drive circuit 4 to the selected data line DL selected by the column decoder circuit 3. In addition, in the reading operation, a reading voltage or a reading current outputted to the data I/O terminal DIO of the memory cell MC connected to the selected data line DL selected by the column decoder circuit 3 is selectively transferred to the reading circuit 7. The above function of the column decoder circuit 3 can be implemented based on a circuit configuration of a well-known column decoder circuit, and the specific circuit configuration of the column decoder circuit 3 is not a main object of the present invention, so that the detailed description is omitted.

The data line drive circuit 4 applies the writing voltage VW corresponding to the input data to the selected data line DL selected by the column decoder circuit 3, and applies a writing inhibition voltage VIW which will be described below to the unselected data line DL not selected by the column decoder circuit 3 and not serving as the writing target. A correspondence relationship between the input data and the writing voltage VW, a specific example of the writing inhibition voltage VIW, and the like will be described in detail in a description of the writing operation below. In addition, the data line drive circuit 4 can be implemented based on a well-known signal line drive circuit or the like, and the specific circuit configuration of the data line drive circuit 4 is not a main object of the present invention, so that the detailed description is omitted.

The first row decoder circuit 5 is a circuit for selecting the first word line WL serving as the writing operation and initialization operation targets, based on the row address signal RA. More specifically, the first row decoder circuit 5 applies a first selected row voltage VRSL1 to the first word line WL connected to the memory cell MC in the one selected row serving as the writing or initialization target, to turn on the second transistor element T2 of the memory cell MC in the selected row, while the first row decoder circuit 5 applies a first unselected row voltage VRUS1 to the first word line WL connected to the memory cell MC in the unselected row not serving as the writing or the initialization target, to turn off the second transistor element T2 in the memory cell MC in the unselected row. In addition, the initialization operation can be executed by the row, or can be executed by the plurality of the rows together. In the case where the initialization operation is collectively executed for the plurality of the rows (all of the rows, for example), the plurality of the rows are selected. Furthermore in the reading operation, the first row decoder circuit 5 applies a first reading row voltage VRR1 to the first word lines WL in all of the rows, to turn off the second transistor elements. In addition, the first unselected row voltage VRUS1 and the first reading row voltage VRR1 may be the same voltage. The first row decoder circuit 5 can be implemented based on a well-known row decoder circuit, and the specific circuit configuration of the first row decoder circuit 5 is not a main object of the present invention, so that the detailed description is omitted.

In the writing operation, the second row decoder circuit 6 applies a second writing row voltage VRW2 to the second word lines GL in all of the rows to set the switching elements S1 to a non-conducting state. In the initialization operation, the second row decoder circuit 6 applies a second initialization selected row voltage VRSE2 to the second word lines GL connected to the memory cells MC in the one or more selected rows serving as the initialization target, to set the switching element S1 of the memory cell MC in the selected row to a conducting state, while the second row decoder circuit 6 applies a second initialization unselected row voltage VRUSE2 to the second word line GL connected to the unselected memory cell MC not serving as the initialization target, to set the switching element S1 of the memory cell MC in the unselected row to the non-conducting state. Furthermore, in the reading operation, the second row decoder circuit 6 applies a second reading selected row voltage VRSR2 to the second word line GL connected to the memory cell MC in the one selected row serving as the reading target to set the switching element S1 of the memory cell MC in the selected row to the conducting state, while the second row decoder circuit 6 applies a second reading unselected row voltage VRUSR2 to the second word line GL connected to the memory cell MC in the unselected row not serving as the reading target to set the switching element S1 of the memory cell MC in the unselected row to the non-conducting state. In addition, the second initialization selected row voltage VRSE2 and the second reading selected row voltage VRSR2 may be the same voltage. In addition, the second writing row voltage VRW2, the second initialization unselected row voltage VRUSE2, and the second reading unselected row voltage VRUSR2 may be the same voltage. The second row decoder circuit 6 can be implemented based on a well-known row decoder circuit, and the specific circuit configuration of the second row decoder circuit 6 is not a main object of the present invention, so that the detailed description is omitted.

In the reading operation, the reading circuit 7 selectively detects the reading voltage or the reading current outputted to the selected data line DL in the selected column selected by the column decoder circuit 3, among the reading voltages or the reading currents outputted to the data line DL from the memory cell in the selected row selected by the second row decoder circuit 6, and reads information stored in the selected memory cell positioned in the selected row and the selected column. The reading circuit 7 is formed of a voltage detection type sense amplifier when the reading circuit 7 detects the reading voltage, while the reading circuit 7 is formed of a current detection type sense amplifier when the reading circuit 7 detects the reading current. A specific circuit configuration of the reading circuit 7 can use a circuit configuration of a well-known sense amplifier as the voltage detection type and the current detection type sense amplifiers, and is not a main object of the present invention, so that the detailed description is omitted.

Second Embodiment

In the second embodiment, a detailed description will be given to the initialization operation, the writing operation, and the reading operation with respect to the memory cell array MA, in the memory device and the circuit configuration of the memory cell described in the first embodiment. In the following description, it is assumed that the input data having a plurality of bits and being inputted from the data input signal DIN is divided to every two bits, one of four-value data (0 to 3) each having the two bits is written in the one memory cell MC, and one of the four-value data written in each memory cell MC is read. In addition, according to this embodiment, a voltage state in the memory node N1 which is initialized by the initialization operation is allocated to the one data value "3" in the four-value data, but it is not always necessary to allocate the initialized voltage state to the one data value.

In addition, in the following description, it is assumed that a typical value of threshold voltages of the first to fourth transistor elements T1 to T4 is 1.0 V, and the variation of the typical value falls within ±0.2 V, as one example.

<Initialization Operation and Writing Operation>

The initialization operation is performed such that an initialization voltage VME equivalent to a memory voltage VM3 which corresponds to the data value "3" and is higher than three memory voltages VM0 to VM2 corresponding to the data values "0" to "2" stored in the memory node N1 of the memory cell MC is written in the memory node N1. Therefore, according to this embodiment, the initialization operation is an operation to initialize the memory state of the memory cell to the data value "3". As for the memory cells MC storing the data values "0" to "2", the initialization operation is an operation to raise (charge) the voltage state of the memory node N1 of the memory cell MC from one of the voltage states of the memory voltages VM0 to VM2 to the initialization voltage VME. As for the memory cell MC storing the data value "3", the initialization operation is an operation to correct and reset a fluctuation of the voltage state of the memory node N1 of the memory cell MC to the original initialization voltage VME. In the following description, it is assumed that a relationship between the memory voltages VM0 to VM2 and the initialization voltage VME satisfies a relationship shown in the following formula 1.

VM0<VM1<VM2<VME  (Formula 1)

The initialization operation is executed by the row. The following description is given to a case where the initialization operation is executed for the memory cells MC in the one selected row, but the operation can be similarly performed even in a case where the memory cells MC in the plurality of the rows are initialized together, by selecting the plurality of the rows.

The writing operation is performed such that any one of the three memory voltages VM0 to VM2 corresponding to the data values "0" to "2" is written in the memory node N1 of the initialized memory cell MC. More specifically, the writing operation is an operation to lower (discharge) the voltage state of the memory node N1 of the memory cell MC from the initialization voltage VME to any one of the voltage states of the memory voltages VM0 to VM2.

The writing operation is performed by the memory cell. However, the respective writing operations for the memory cells MC in the same row can be executed at the same time. In this case, the writing operation can be collectively performed for the memory cells MC in the selected one row belonging to all of the columns, or the writing operation can be selectively performed for the memory cells MC belonging to the one or more selected columns.

Figure 6:
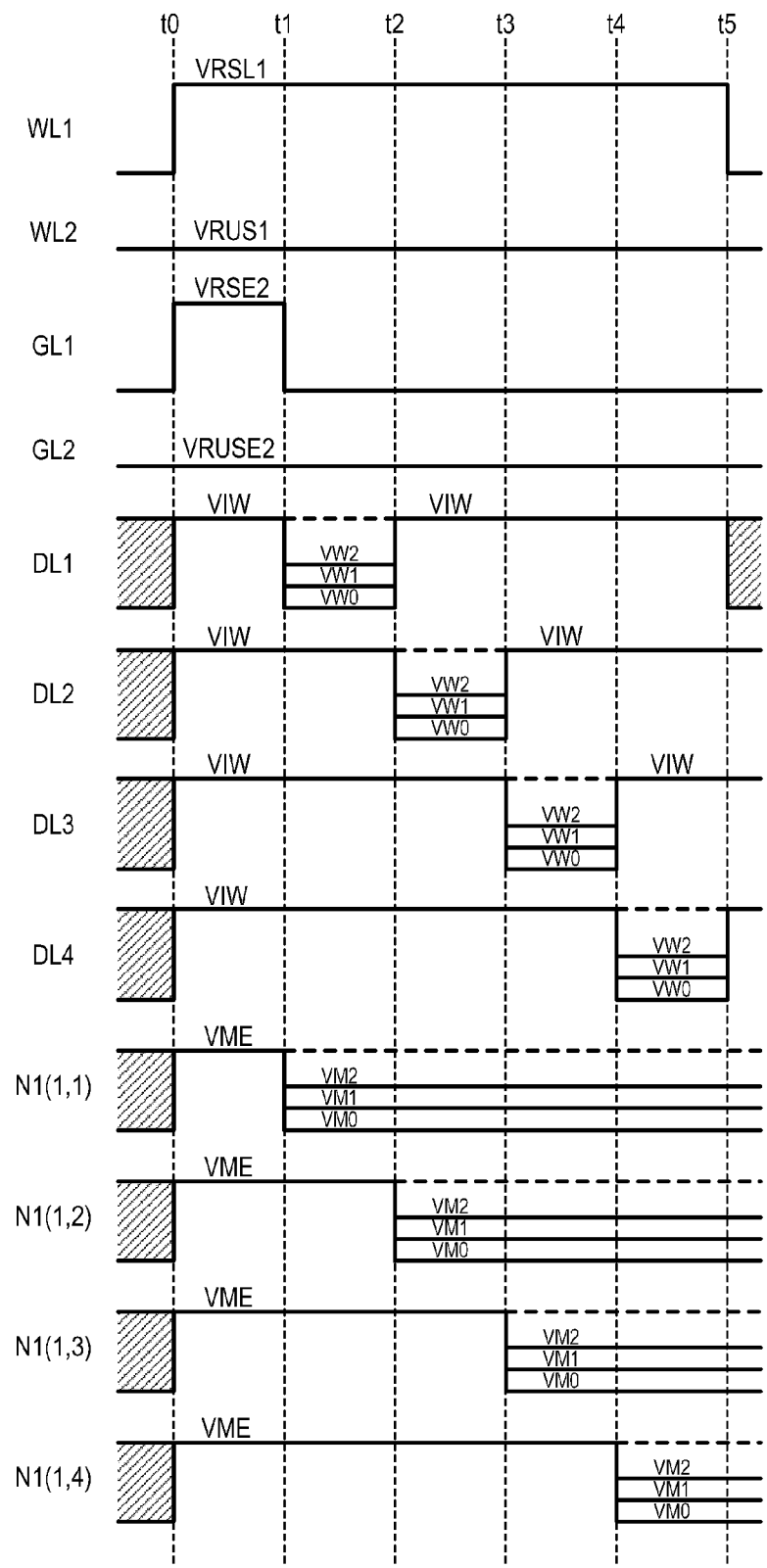
FIG. 6 is a timing chart showing one example of an operation procedure of an initialization operation and a writing operation.

FIG. 6 shows a timing chart in a case where the initialization operation is performed for the one selected row, and the writing operation is performed therein by sequentially selecting the plurality of data lines DL. As one example, it is assumed that the memory cells MC(1) to MC(m) in the initialized row belonging to all of the columns are divided into four groups, and the writing operation is performed for the memory cells MC in each group at the same time. The column number of each group is set to k (=m/4). Hereinafter, for the sake of description, it is assumed that the first group is a group having the column number of 4j+1 (j=0 to k−1), the second group is a group having the column number of 4j+2 (j=0 to k−1), the third group is a group having the column number of 4j+3 (j=0 to k−1), and the fourth group is a group having the column number of 4j+4 (j=0 to k−1). In addition, it is assumed that the first row is the selected row, and the second row to the nth row are unselected rows.

FIG. 6 shows the respective voltage levels of the first word line WL1 in the selected row (first row), the first word line WL2 in the unselected row (second row), the second word line GL1 in the selected row (first row), the second word line GL2 in the unselected row (second row), the data line DL1 in the first column representing the first group, the data line DL2 in the second column representing the second group, the data line DL3 in the third column representing the third group, the data line DL4 in the fourth column representing the fourth group, the memory node N1 (1, 1) of the memory cell MC in the first column representing the first group, the memory node N1 (1, 2) of the memory cell MC in the second column representing the second group, the memory node N1 (1, 3) of the memory cell MC in the third column representing the third group, and the memory node N1 (1, 4) of the memory cell MC in the fourth column representing the fourth group.

The initialization operation is performed for all of the memory cells MC in the first row during a period of times t0 to t1, the writing operation is performed for all of the memory cells MC in the first group during a period of times t1 to t2, the writing operation is performed for all of the memory cells MC in the second group during a period of times t2 to t3, the writing operation is performed for all of the memory cells MC in the third group during a period of times t3 to t4, and the writing operation is performed for all of the memory cells MC in the fourth group during a period of times t4 to t5.

Figure 7A:
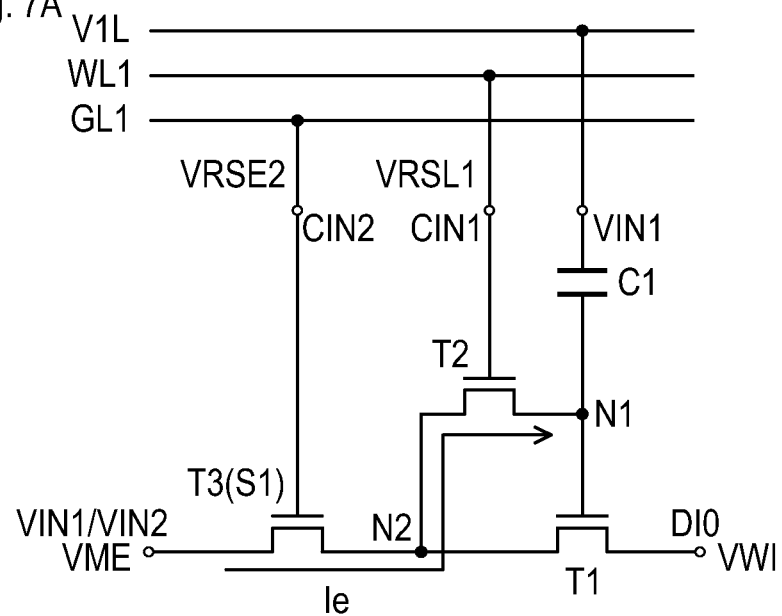
FIGS. 7A and 7B are circuit diagrams showing states of transistor elements in memory cells in a selected row and an unselected row in the initialization operation, respectively.
Figure 7B:
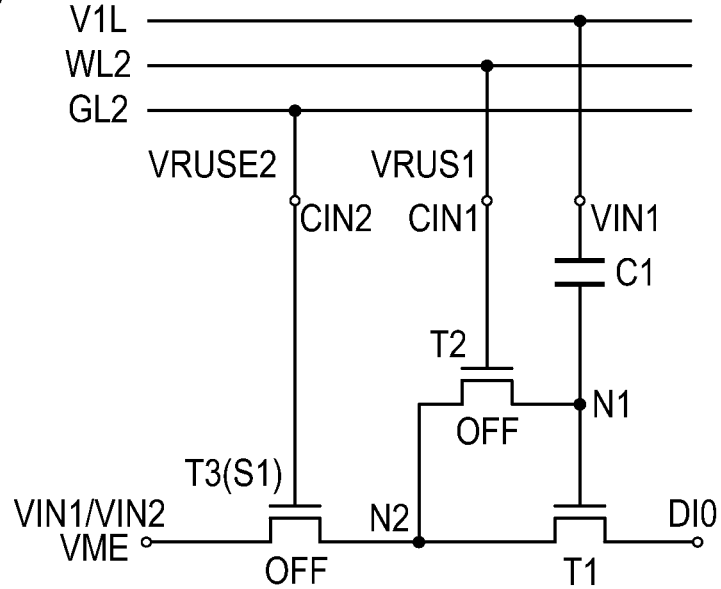

Hereinafter, a detailed description will be given to the initialization operation and the writing operation, with reference to FIGS. 6, 7A-7B and 8A-8C, assuming that the memory cell MC is the first type memory cell MC1 shown in FIG. 1A. FIG. 7A shows a state of the transistor element and an initialization current Ie in the memory cell MC in the selected row, in the initialization operation, FIG. 7B shows a state of the transistor element in the memory cell MC in the unselected row, in the initialization operation, FIG. 8A shows a state of the transistor element and a writing current Iw in the selected memory cell MC, in the writing operation, FIG. 8B shows a state of the transistor element in the memory cell MC in the selected row belonging to the unselected group, in the writing operation, and FIG. 8C shows a state of the transistor element in the memory cell MC in the unselected row, in the writing operation. In addition, "OFF" shown under the transistor element in FIGS. 7A-7B and 8A-8C shows that the transistor element is in an off state.

<Initialization Operation>

In the case where the memory cell MC includes the second voltage terminal VIN2, the initialization voltage VME is supplied to the second fixed voltage line V2L, and in the case where the memory cell MC does not include the second voltage terminal VIN2, the initialization voltage VME is supplied to the first fixed voltage line V1L. In the case where the initialization voltage VME is supplied to the second fixed voltage line V2L, the initialization voltage VME only has to be supplied during the initialization operation (times t0 to t1). However, in the case where the initialization voltage VME is supplied to the first fixed voltage line V1L, the initialization voltage VME is supplied to keep the same voltage level during the writing operation, the reading operation, and a data retention period.

At the start of the initialization operation (time t0), the first selected row voltage VRSL1 is applied to the first word line WL1 in the selected row (first row), and the second initialization selected row voltage VRSE2 is applied to the second word line GL1 in the selected row (first row), so that the second transistor elements T2 and the third transistor elements T3 in all of the memory cells MC in the selected row (first row) are both turned on. The voltage levels of the first selected row voltage VRSL1 and the second initialization selected row voltage VRSE2 are set so as to be higher than a voltage value Va (=VME+Vtmax) provided by adding a maximum value Vtmax (=1.2 V) in fluctuation ranges of threshold voltages Vt2 and Vt3 of the second transistor element T2 and the third transistor element T3 to the initialization voltage VME. Thus, the voltage level of the memory nodes N1 in all of the memory cells MC is initialized to the initialization voltage VME through the on-state second transistor elements T2 and third transistor elements T3.

In addition, when the voltage of the data line DL in each column is lower than a voltage value Vb (=VME−Vt1min) provided by subtracting a minimum value Vt1min (=0.8 V) in a fluctuation range of a threshold voltage Vt1 of the first transistor element T1 from the initialization voltage VME, there is a possibility that the first transistor element T1 is turned on, and accumulated charges in the memory node N1 is extracted to the data line DL through the first transistor element T1 and the second transistor element T2, and as a result the initialization operation is not be correctly performed. Therefore, the voltage state of the data line DL in each column is set at the writing inhibition voltage VIW higher than the voltage value Vb during the period of the initialization operation. As one example, the writing inhibition voltage VIW is set to be the initialization voltage VME or higher.

As for the memory cell MC having the one data value of "0" to "2" stored in the memory node N1 before the initialization, the voltage of the memory node N1 is lower than the initialization voltage VME, so that the initialization current Ie flows through the second transistor element T2 and the third transistor element T3, and the memory node N1 is charged to the initialization voltage VME. In addition, as for the memory cell MC having the data value "3" stored in the memory node N1 before the initialization, the memory node N1 is maintained in the state initialized to the initialization voltage VME in the previous initialization operation, so that when the voltage is fluctuated due to a leak current or the like, the memory node N1 is reset to the initialization voltage VME through the second transistor element T2 and the third transistor element T3.

In the initialization operation (times t0 to t1), the first unselected row voltage VRUS1 is applied to the first word lines WL2 to WLn in the unselected rows (second to nth rows), and the second initialization unselected row voltage VRUSE2 is applied to the second word lines GL2 to GLn of the unselected rows (second to nth rows), so that the second transistor elements T2 and the third transistor elements T3 in all of the memory cells MC in the unselected rows (second to nth rows) are turned off. Thus, the memory node N1 of each memory cell MC in the unselected rows becomes a floating state, and the initialization operation is not performed, and the voltage state before the initialization operation is maintained.

In addition, even when the second initialization selected row voltage VRSE2 is applied to the second word lines GL2 to GLn in the unselected rows (second to nth rows), similarly to the second word line GL1 in the selected row (first row) to turn on the third transistor element T3, the initialization operation is not performed as long as the second transistor element T2 is in the off state. Furthermore, the voltage levels of the first unselected row voltage VRUS1 and the second initialization unselected row voltage VRUSE2 only have to be set lower than a voltage provided by adding a minimum value Vtmin (=0.8 V) in fluctuation ranges of the threshold voltages Vt2 and Vt3 of the second transistor element T2 and the third transistor element T3 to a lower limit value of voltage ranges that the memory node N1 and the intermediate node N2 can take.

When the signal level applied to the second word line GL1 in the selected row (first row) shifts from the second initialization selected row voltage VRSE2 to the second initialization unselected row voltage VRUSE2 at the time t1, the initialization operation ends. In a case where after the initialization operation, the writing operation is continuously performed for the selected row (first row) which has been the initialization operation target, the first selected row voltage VRSL1 is continuously applied to the first word line WL1 in the selected row (first row). In a case where after the initialization operation, the initialization operation is performed for another row, or the writing operation is performed for the other row which is initialized, in a case where the reading operation is performed for a certain row, or in a case where the data stored in each memory cell MC is retained without performing any memory operation, the signal level applied to the first word line WL1 in the selected row (first row) shifts from the first selected row voltage VRSL1 to the first unselected row voltage VRUS1 at the time t1. According to the timing chart illustrate FIG. 6, the writing operation is continuously performed in the same selected row (first row), so that the first selected row voltage VRSL1 is continuously applied to the first word line WL1 as described above.

<Writing Operation>

According to the timing chart illustrated in FIG. 6, the writing operations for the memory cells MC belonging to the four groups are executed sequentially in each group during the four sequential writing operation periods of the times t1 to t2, the times t2 to t3, the times t3 to t4, and the times t4 to t5, respectively. The writing operation for the memory cells MC belonging to the same group is collectively executed at the same time in one writing operation period. However, the writing voltage VW corresponding to data to be written is applied to each memory cell MC in the one group serving as the writing target through the data line DL by the memory cell.

According to the timing chart illustrated in FIG. 6, the writing operation is continuously performed following the initialization operation for the same selected row (first row) which is the initialization operation target, so that the first selected row voltage VRSL1 is continuously applied to the first word line WL1 during the four writing operation periods of the time t1 to the time t5. The first unselected row voltage VRUS1 is applied to the first word lines WL2 to WLn in the unselected rows (second to nth rows), similarly to the time of the initialization operation (times t0 to t1). The second writing row voltage VRW2 which is set on the same basis as the second initialization unselected row voltage VRUSE2 is applied to the second word lines GL2 in all of the rows. Thus, the second transistor elements T2 in the memory cells MC in the selected row (first row) belonging to all of the groups are turned on, and the second transistor elements T2 in the memory cells MC in the unselected rows belonging to all of the groups are turned off, throughout the four writing operation periods. In addition, the third transistor elements T3 in the memory cells MC in the selected row (first row) and the unselected rows (second to nth rows) belonging to all of the groups are all turned off. Therefore, in the writing operation, when the row serving as the writing target is selected, the on/off of the second transistor element T2 is controlled.

According to this embodiment, as illustrated in FIG. 6, in the case where the memory cells MC are divided into the four groups to perform the writing operations sequentially, and the data to be written is one of "0" to "2", one of writing voltages VW0 to VW2 corresponding to that data is applied from the data line drive circuit 4 to each data line DL in the memory cell MC belonging to the selected group serving as the writing target. When the data to be written is "3", the writing inhibition voltage VIW (initialization voltage VME or higher) is applied (shown by a broken line in FIG. 6) to the data line DL because the data is written in the initialization operation. In addition, the writing inhibition voltage VIW (initialization voltage VME or higher) is applied to each data line DL in the memory cell MC belonging to the unselected group not serving as the writing target.

As described above, the writing operation is the operation to lower (discharge) the voltage state of the memory node N1 in the memory cell MC in the selected group from the initialization voltage VME to one voltage state among the memory voltages VM0 to VM2. Here, the writing voltages VW0 to VW2 are set to be lower than the memory voltages VM0 to VM2 by the threshold voltage Vt1 of the first transistor element T1, respectively. At the time of starting the writing operation, since the second transistor element T2 is in the on state, each voltage of the gate electrode (memory node N1) and the drain electrode (intermediate node N2) of the first transistor element T1 is at the initialization voltage VME, and the source electrode thereof is at one of the writing voltages VW0 to VW2 which are lower than the voltage lower than the initialization voltage VME by the threshold voltage Vt1 of the first transistor element T1. Thus, the first transistor element T1 is turned on, and the writing current Iw flows from the memory node N1 to the data line DL through the second transistor element T2 and the first transistor element T1. As a result, the voltages of the memory node N1 and the intermediate node N2 gradually decrease, and when voltages reach the voltage level which is higher than the writing voltages VW0 to VW2 by the actual threshold voltage Vt1 of the first transistor element T1 of the memory cell MC which is being subjected to the writing operation, the first transistor element T1 cuts off, and the discharging stops, so that the writing operation ends automatically.

A relationship between the writing voltages VW0 to VW2 and the writing inhibition voltage VIW is set to satisfy a relationship shown in the following formula 2 so that the relationship between the memory voltages VM0 to VM2 and the initialization voltage VME satisfies the relationship shown in the formula 1.

$$VW0 < VW1 < VW2 < VIW \qquad \text{(Formula 2)}$$

Here, in the above writing operation, it is to be noted that in a case where the threshold voltage Vt1 fluctuates with respect to the typical value 1.0 V within a variation range (±0.2 V), the one of the memory voltages VM0 to VM2 actually retained in the memory node N1 is higher than the writing voltages VW0 to VW2 by the threshold voltage Vt1 to which an actual variation amount is added. Although it is described in detail in the reading operation below, the fluctuation of the threshold voltage Vt1 is compensated in the memory voltages VM0 to VM2 actually retained in the memory node N1, so that an operation margin at the time of the reading operation can be considerably improved.

In the case where the data to be written in the memory cell MC belonging to the selected group is "3", since the writing inhibition voltage VIW (initialization voltage VME or higher) is applied to the data line DL, the source voltage of the first transistor element T1 is equal to or higher than the initialization voltage VME retained in the memory node N1, so that the first transistor element T1 is turned off, and a current does not flow between the memory node N1 and the data line DL in any direction. Therefore, the initialization voltage VME is maintained in the memory node N1 as the voltage state after initialized (shown by a broken line in FIG. 6).

Meanwhile, as for the memory cell MC in the unselected row and in the same column as the memory cell MC belonging to the selected group, the second transistor element T2 is in the off state, so that even when any of the writing voltages VW0 to VW2 is applied to the data line DL, the voltage state of the memory node N1 is maintained at one of the memory voltages VM0 to VM2 or the initialization voltage VME that is retained at that point although the voltage of the intermediate node N2 could be discharged to one of the writing voltages VW0 to VW2.

The writing inhabitation voltage VIW (initialization voltage VME or higher) is applied to the data line DL of the memory cell MC in the same selected row (first row) belonging to the unselected group. The initialization voltage VME is retained in the memory node N1 of the memory cell MC belonging to the unselected group after the initialization operation and before the writing operation, the source voltage of the first transistor element T1 is equal to or higher than the initialization voltage VME which is the gate voltage, and the gate voltage and the drain voltage are the same voltage through the second transistor element T2. Thus, the first transistor element T1 is turned off, and a current does not flow between the memory node N1 and the data line DL in any direction. Thus, the memory node N1 is maintained at the initialization voltage VME which is the voltage state after the initialized. Meanwhile, as for the memory cell MC belonging to the unselected group in which the writing operation is performed after the initialization operation, the memory node N1 is maintained at one of the memory voltages VM0 to VM2 in which the fluctuation amount of the threshold voltage Vt1 of the first transistor element T1 is compensated or the initialization voltage VME. Even when one of the memory voltages VM0 to VM2 lower than the initialization voltage VME is retained, the source voltage of the first transistor element T1 is higher than the memory voltages VM0 to VM2 which are the gate voltage, and the gate voltage and the drain voltage are the same voltage through the second transistor element T2, so that the first transistor element T1 is turned off, and a current does not flow between the memory node N1 and the data line DL in any direction. Thus, the memory node N1 is maintained at one of the memory voltages VM0 to VM2 which is the voltage state after the writing operation, or the initialization voltage VME.

In the above description, it has been described that as for the memory voltages VM0 to VM2 retained in the memory node N1, the fluctuation amount of the threshold voltage Vt1 of the first transistor element T1 is compensated, but as for the initialization voltage VME retained in the memory node N1, the fluctuation amount of the threshold voltage Vt1 of the first transistor element T1 is not compensated. However, the initialization voltage VME can be set to be higher than the memory voltages VM0 to VM2 corresponding to the four-value data values "0" to "2", so that when the voltage VME is set with taking account of the fluctuation amount of the threshold voltage Vt1, it is not affected by the fluctuation of the threshold voltage Vt1.

<Reading Operation>

Next, the reading operation will be described. The reading operation is performed such that the reading circuit 7 reads one of the data values "0" to "3" stored in the memory cell MC, from the memory cell MC serving as the reading target. First, the description will be given to a case where the reading circuit 7 is the voltage detection type sense amplifier, with reference to FIGS. 9 and 10A-10C.

Figure 9:
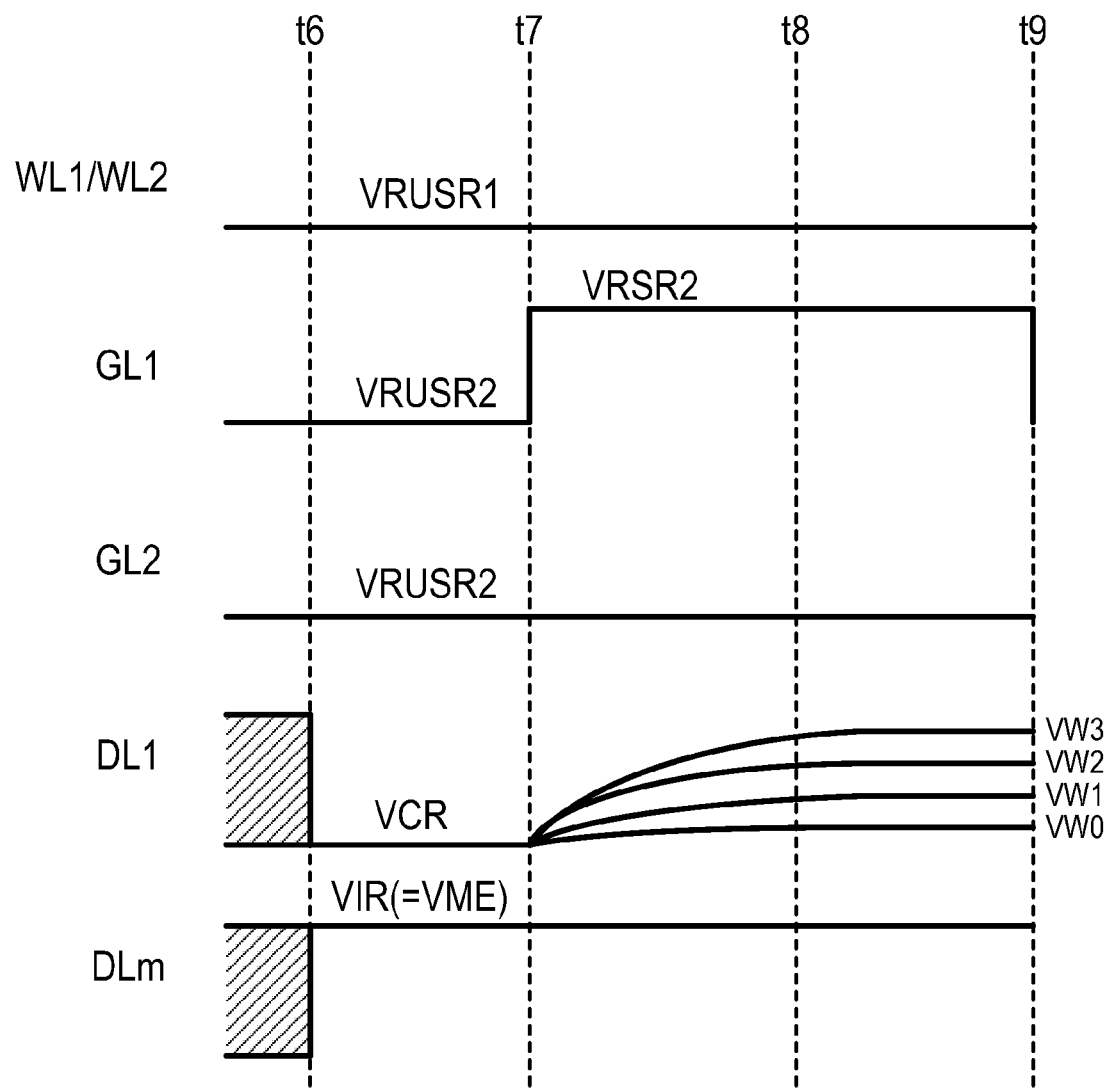
FIG. 9 is a timing chart showing one example of an operation procedure of a reading operation in a case where a reading circuit is a voltage detection type sense amplifier.

FIG. 9 shows a timing chart in a case where the reading operation is performed for the one selected row in which the writing operation is performed by selecting one or more data lines DL. As one example, it is assumed that the first row is the selected row, and the second to nth rows are unselected rows. Furthermore, as for the reading operation, it is assumed that one or more columns are selected in the selected row, and the reading operation is performed for the memory cells MC in the selected columns at the same time. Similar to the descriptions of the initialization operation and the writing operation, it is assumed that the memory cell MC is the first type memory cell MC1 shown in FIG. 1A.

FIG. 9 shows voltage levels of the first word line WL1 in the selected row (first row), the first word line WL2 in the unselected row (second row), the second word line GL1 in the selected row (first row), the second word line GL2 in the unselected row (second row), the data line DL1 in the first column representing the selected column, and the data line DLm in the mth column representing the unselected column.

Figure 10A:
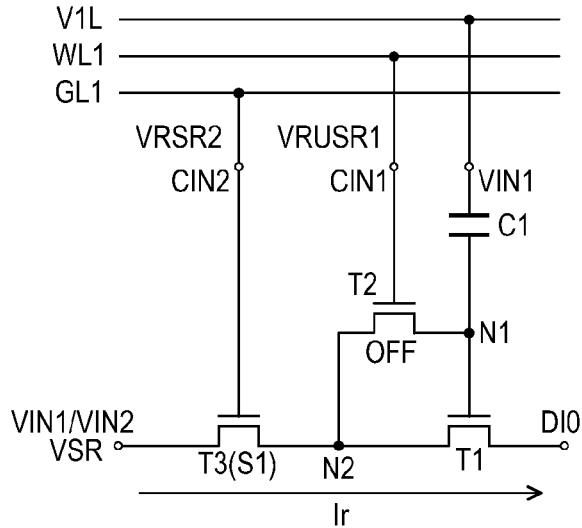
FIGS. 10A to 10C are circuit diagrams showing states of transistor elements in the memory cells in the selected row and the unselected row at the time of the reading operation.
Figure 10B:
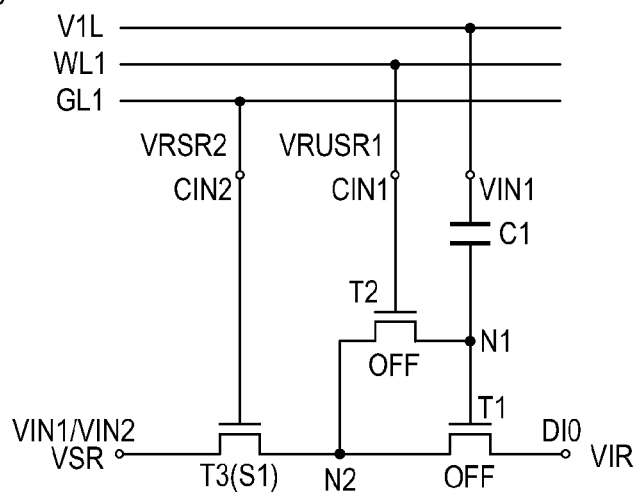
Figure 10C:
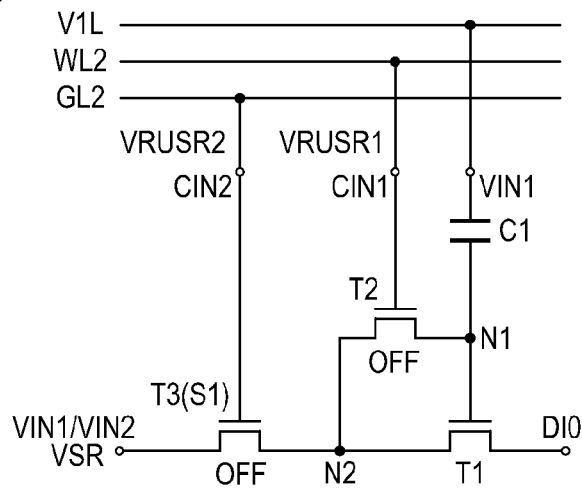

FIG. 10A shows a state of the transistor element and a reading current Ir in the memory cell MC selected in the reading operation, FIG. 10B shows a state of a transistor element in the memory cell MC in the unselected column in the selected row in the reading operation, and FIG. 10C shows a state of the transistor element in the memory cell MC in the unselected row in the reading operation. In addition, "OFF" shown under the transistor element in FIGS. 10A-10C shows that the transistor element is in an off state.

In the case where the memory cell MC includes the second voltage terminal VIN2, a reading power supply voltage VSR is supplied to the second fixed voltage line V2L, and in the case where the memory cell MC does not include the second voltage terminal VIN2, the reading power supply voltage VSR is supplied to the first fixed voltage line V1L. In the case where the reading power supply voltage VSR is supplied to the second fixed voltage line V2L, the reading power supply voltage VSR only has to be supplied for times t7 to t9 during the period of the reading operation. However, in the case where the reading power supply voltage VSR is supplied to the first fixed voltage line V1L, the reading power supply voltage VSR is supplied to keep the same voltage level during the writing operation, the reading operation, and data retention period. Therefore, the reading power supply voltage VSR and the initialization voltage VME are set at the same voltage. In the case where the memory cell MC includes the second voltage terminal VIN2, the reading power supply voltage VSR and the initialization voltage VME may not always be the same voltage, but the reading power supply voltage VSR needs to be higher than the voltage provided by adding a voltage drop amount in the third transistor element T3 to the above-described voltage value Vb (=VME−Vt1min), in order to operate the first transistor element T1 in a saturation region in the reading operation. Hereinafter, it is assumed that the reading power supply voltage VSR is equal to or higher than the initialization voltage VME.

During times t6 to t7 in the period of the reading operation, a preliminary drive operation is performed to drive the data line DL1 in the selected column (first column) at a reading column voltage VCR which is equal to or lower than the lowest writing voltage VW0. According to this embodiment, as one example, the reading column voltage VCR is set at the same voltage as the writing voltage VW0. At the time t7, the preliminary driving for the data line DL1 in the selected column (first column) ends, and then the data line DL1 becomes a floating state. The data line DLm in the unselected column (mth column) is driven at a reading inhibition voltage VIR during the period of the reading operation (t6 to t9). The reading inhibition column voltage VIR is set at a voltage higher than the above-described voltage value Vb (=VME−Vt1min) similar to the reading power supply voltage VSR. According to this embodiment, as one example, it is assumed that the reading inhibition column voltage VIR and the initialization voltage VME are the same voltage.

When the preliminary drive operation for the data line DL1 in the selected column (first column) ends (at the time t7), a second reading selected row voltage VRSR2 is applied to the second word line GL1 in the selected row (first row). A second reading unselected row voltage VRUSR2 is applied to the second word lines GL2 to GLn in the unselected rows (second to nth rows), and a first reading row voltage VRUSR1 is applied to all of the first word lines WL1 to WLn in the selected row (first row) and the unselected rows (second to nth rows) during the period of the reading operation (t6 to t9). Thus, during the period of the reading operation (times t6 to t9), the second transistor elements T2 of all of the memory cells MC are turned off, and the third transistor elements T3 of the memory cells MC in the unselected rows (second to nth rows) are turned off regardless of the voltage level of the data line DL. Meanwhile, the third transistor element T3 of the memory cell MC in the selected row (first row) is turned on based on the voltage level of the data line DL during the time t7 to t9.

At the time t7, the source voltage of the first transistor element T1 of the selected memory cell MC is charged to the reading column voltage VCR (=VW0). Meanwhile, the gate voltage is one of the memory voltages VM0 to VM2, or VME (=VM3) corresponding to one of the memory data "0" to "3". Therefore, drain currents IDS1 (0 to 3) of the first transistor element T1 at the time of the operation in the saturation region based on the memory data at the time t7 are represented by following formula 3 to formula 6, respectively. In addition, a coefficient β in the formula 3 to formula 6 represents a transconductance of the first transistor element T1. The drain currents IDS1 (0 to 3) are shown as the reading current Ir in FIG. 10A.

$$IDS1(0) = \beta \times (VM0 - VCR - Vt1)^2 / 2 \quad \text{(Formula 3)}$$
$$= \beta \times (VW0 - VCR)^2 / 2$$
$$= 0$$

$$IDS1(1) = \beta \times (VM1 - VCR - Vt1)^2 / 2 \quad \text{(Formula 4)}$$
$$= \beta \times (VW1 - VCR)^2 / 2$$

$$IDS1(2) = \beta \times (VM2 - VCR - Vt1)^2 / 2 \quad \text{(Formula 5)}$$
$$= \beta \times (VW2 - VCR)^2 / 2$$

$$IDS1(3) = \beta \times (VME - VCR - Vt1)^2 / 2 \quad \text{(Formula 6)}$$

From the relationship shown in the formula 1, the drain currents IDS1 (0 to 3) satisfy a relationship shown in the following formula 7. Here, the second reading selected row voltage VRSR2 to be applied to the second word line GL1 in the selected row (first row) is preferably set so that the first transistor element T1 is operated in the saturation region even when the third transistor element T3 applies the drain current IDS1 (3). In a case where the first transistor element T1 is operated in a linear region (triode region) due to a voltage drop of the third transistor element T3, the drain current IDS1 (3) is prevented from reducing by previously setting the initialization voltage VME to be relatively high, so that the following formula 7 can be maintained.

$$IDS1(3) > IDS1(2) > IDS1(1) > IDS1(0) = 0 \quad \text{(Formula 7)}$$

After the time t7, when the memory data is "0", the voltage level of the data line DL1 remains at the reading column voltage VCR, and when the memory data is one of "1" to "3", the voltage level of the data line DL1 is charged by one of the drain current IDS1 (1 to 3) corresponding to the memory data and rises. In addition, a voltage difference between the gate electrode and the source electrode of the first transistor element T1 reduces with an increase of the voltage level of data line DL4, so that the drain currents IDS1 (1 to 3) gradually reduce, and the voltage level of the data line DL1 rises up to the writing voltage VW1 when the memory data is "1", the voltage level of the data line DL1 rises up to the writing voltage VW2 when the memory data is "2", and the voltage level of the data line DL1 rises up to the writing voltage VW3 (=VME−Vt1) provided by subtracting the threshold voltage Vt1 from the initialization voltage VME when the memory data is "3". Therefore, after the latest point (time t8) among a point in time when the voltage level of the data line DL1 exceeds a reference voltage Vref1 between the writing voltage VW0 and the writing voltage VW1 in the case of the memory data "1", a point in time when the voltage level of the data line DL1 exceeds a reference voltage Vref2 between the writing voltage VW1 and the writing voltage VW2 in the case of the memory data "2", and a point in time when the voltage level of the data line DL1 exceeds a reference voltage Vref3 between the writing voltage VW2 and the above voltage VW3 in the case of the memory data "3", one of the memory data "0" to "3" to which the voltage level of the data line DL1 corresponds can be read, by detecting the voltage level of the data line DL1 selected by the column decoder circuit 3 and inputted to the voltage detection type sense amplifier (reading circuit 7).

Here, it is to be noted that as for the drain currents IDS1 (0 to 2) shown in the formula 3 to formula 5, since each of the gate voltages VM0 to VM2 includes the actual threshold voltage Vt1 of the first transistor element T1 including the variation, the threshold voltage Vt1 is subtracted in a right side of each formula, and the influence of the variation in the threshold voltage Vt1 is compensated. That is, in the case where the memory data is one of "0" to "2", since the voltage level of the data line DL1 at the time t8 is not affected by the variation in the threshold voltage Vt1, the operation voltage margin at the time of the reading operation can be largely provided, so that noise resistance is improved under the same operation voltage, or the multilevel of the memory data can be further enhanced by narrowing an adjacent voltage difference between the writing voltages VW0 to VW2 and the voltage VW3. In addition, as for the drain current IDS1 (3) shown in the formula 6, the threshold voltage Vt1 is not subtracted and remains in the right side of the formula 6, but by setting the initialization voltage VME so as to be sufficiently higher than the memory voltage VM2 beyond the fluctuation range of the threshold voltage Vt1, it can be unaffected by the variation in the threshold voltage Vt1.

At time t9 after the voltage detection type sense amplifier detects the voltage level of the data line DL1 and reads the memory data, the voltage level of the second word line GL1 in the selected row (first row) shifts from the second reading selected row voltage VRSR2 to the second reading unselected row voltage VRUSR2, and the third transistor element T3 in the selected row (first row) is turned off regardless of the voltage level of the data line DL, so that the reading operation ends.

According to this embodiment, since the data line DLm in the unselected column is driven at the reading inhibition column voltage VIR, the first transistor element T1 of the memory cell MC in the unselected column is in the off state, and the reading current Ir does not flow during the period of the reading operation (t6 to t9). Furthermore, according to this embodiment, the data line DL in the selected column is selected by the column decoder circuit 3, and connected to the voltage detection type sense amplifier (reading circuit 7), while the data line DL in the unselected column is separated from the reading circuit 7 by the column decoder circuit 3, so that the preliminary drive operation may be also performed to the data line DL in the unselected column, similarly to the data line DL in the selected column, or the preliminary drive operation may not be performed to the data line DL in the unselected column so that the data line DL may be left as it is.

Third Embodiment

Figure 11:
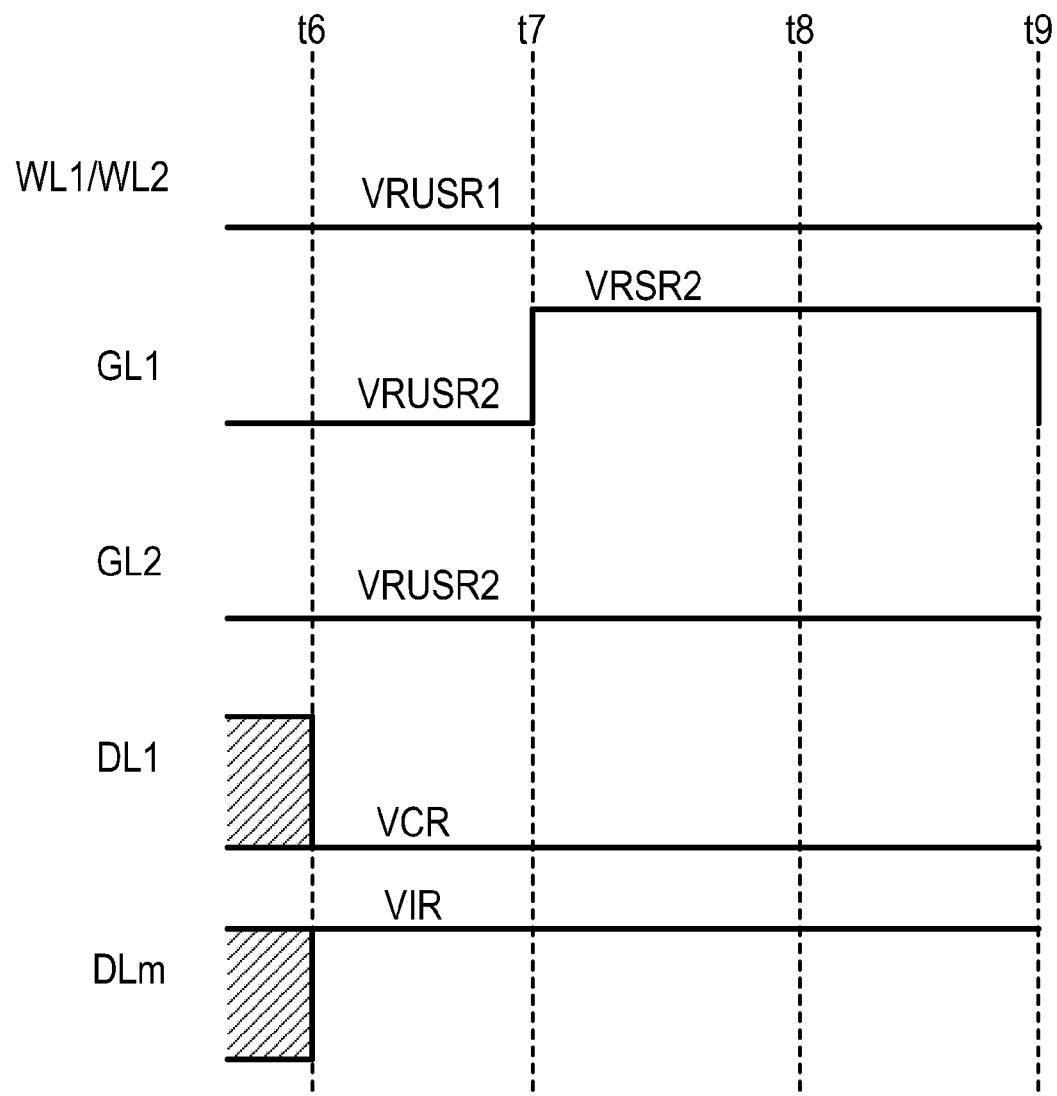
FIG. 11 is a timing chart showing one example of an operation procedure of a reading operation in a case where the reading circuit is a current detection type sense amplifier.
Figure 12:
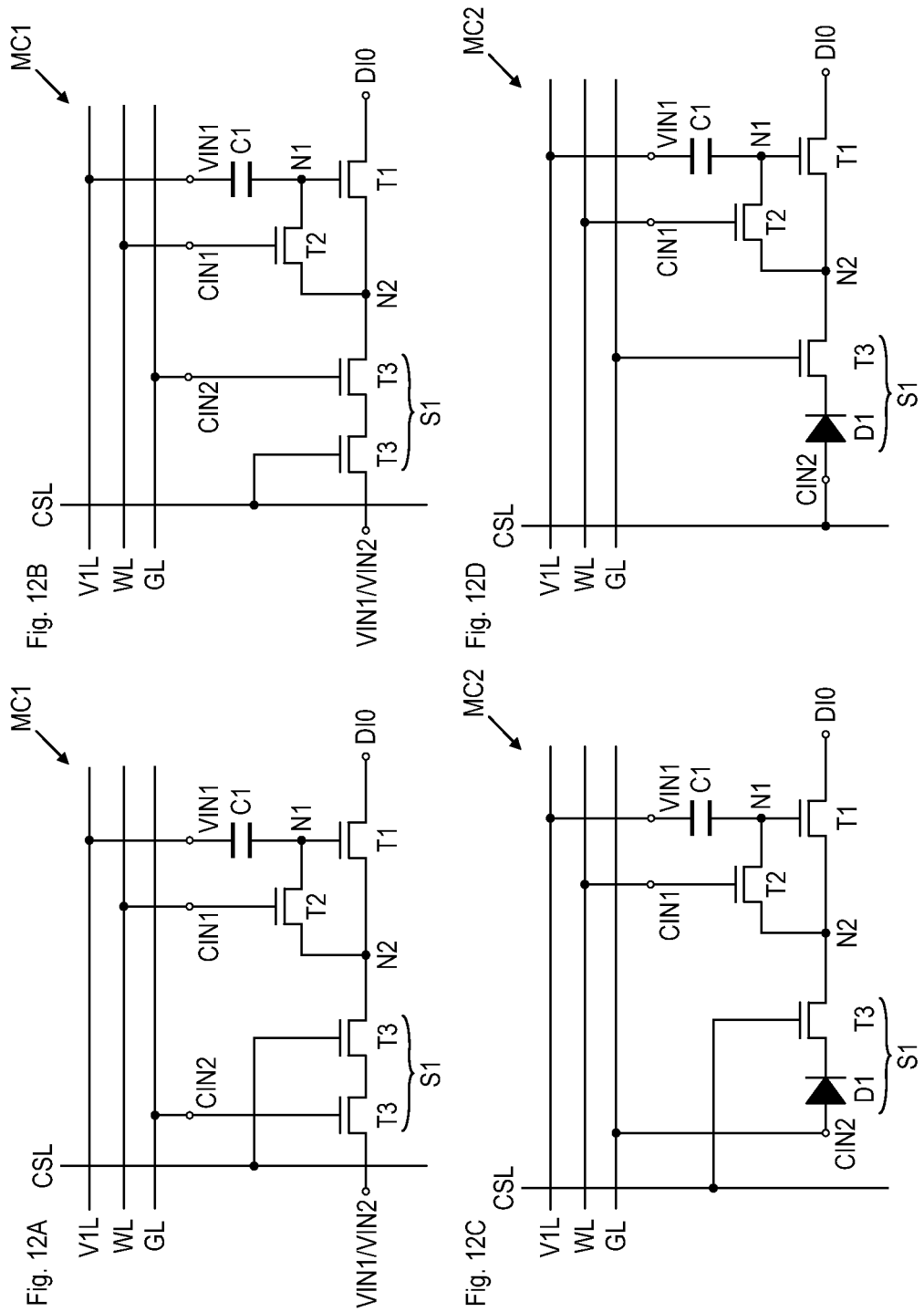
FIGS. 12A to 12D are equivalent circuit diagrams showing other circuit configuration examples of the semiconductor memory circuit according to the present invention.

In the second embodiment the description has been given to the reading operation in the case where the reading circuit 7 is the voltage detection type sense amplifier, and in the third embodiment a description will be given to a reading operation in the case where the reading circuit 7 is the current detection type sense amplifier, with reference to FIGS. 10A-10C and 11. The initialization operation and the writing operation are the same as those described in the second embodiment. FIG. 11 shows a timing chart in a case where the reading operation is performed for one or more data lines DL in the one selected row after the writing operation is performed in the same manner as in FIG. 9. FIGS. 10A-10C are also applied to the case where the reading circuit 7 is the current detection type sense amplifier.

In the case where the reading circuit 7 is the current detection type sense amplifier also, a voltage condition applied to each signal line is the same as that of the voltage detection type sense amplifier except for a voltage drive condition of the data line DL1 in the selected column.

In the case of the current detection type sense amplifier, the data line DL1 in the selected column (first column) is driven at the reading column voltage VCR equal to or lower than the lowest writing voltage VW0 during the period of the reading operation (t6 to t9). Therefore, the voltage level of the data line DL1 is constant regardless of the memory data "0" to "3" during the period of the reading operation (t6 to t9), while the reading current Ir is one of the drain currents IDS1 (0 to 3) shown in the formula 3 to formula 6 in the saturation operation of the first transistor element T1, based on the memory data "0" to "3".

After the time t7, at a point after one of the drain currents IDS1 (1 to 3) comes to flow stably (at the time t8 or later), by detection of the reading current Ir outputted from the memory cell MC to the data line DL1, selected by the column decoder circuit 3, and inputted to the current detection type sense amplifier (reading circuit 7), one of the memory data "0" to "3" to which the current level of the reading current Ir corresponds can be read.

Here, it is to be noted that as for the drain currents IDS1 (0 to 2) shown in the formula 3 to formula 5, since each of the gate voltages VM0 to VM2 includes the actual threshold voltage Vt1 of the first transistor element T1 including the variation, the threshold voltage Vt1 is subtracted in the right side of each formula, so that the influence of the variation of the threshold voltage Vt1 is compensated. That is, in the case where the memory data is one of "0" to "2", since a current level of the reading current Ir at the time t8 is not affected by the variation in the threshold voltage Vt1, the operation voltage margin at the time of the reading operation can be largely provided, so that noise resistance is improved under the same operation voltage, or the multilevel of the memory data can be further enhanced by a decrease of an adjacent voltage difference between the writing voltages VW0 to VW2 and the voltage VW3. In addition, as for the drain current IDS1 (3) shown in the formula 6, the threshold voltage Vt1 is not subtracted and remains in the right side of the formula 6, but by setting the initialization voltage VME so as to be sufficiently higher than the memory voltage VM2 beyond the fluctuation range of the threshold voltage Vt1, it can be unaffected by the variation in the threshold voltage Vt1.

At the time t9 after the current detection type sense amplifier detects the current level of the reading current Ir, and reads the memory data, the voltage level of the second word line GL1 in the selected row (first row) shifts from the second reading selected row voltage VRSR2 to the second reading unselected row voltage VRUSR2, and the third transistor element T3 in the selected row (first row) is turned off regardless of the voltage level of the data line DL, so that the reading operation ends.

According to this embodiment, since the data line DLm in the unselected column is driven at the reading inhibition column voltage VIR, the first transistor element T1 of the memory cell MC in the unselected column is in the off state, and the reading current Ir does not flow during the period of the reading operation (t6 to t9). Furthermore, according to this embodiment, the data line DL in the selected column is selected by the column decoder circuit 3, and connected to the current detection type sense amplifier (reading circuit 7), while the data line DL in the unselected column is separated from the reading circuit 7 by the column decoder circuit 3, so that the data line DL in the unselected row may be driven at the reading column voltage VCR, similarly to the data line DL in the selected column, or may be left as it is without being driven at the reading column voltage VCR.

Fourth Embodiment

In the second and third embodiments, it is assumed that the memory cell MC is the first type memory cell MC1 shown in FIG. 1A, in the descriptions of the initialization operation, the writing operation, and the reading operation. In the fourth embodiment, in a case where the memory cell MC is the second type memory cell MC2 shown in FIGS. 1B and 1C, a description will be complemented with respect to a point different from the case where the memory cell MC is the first type memory cell MC1 described in the second and third embodiments. That is, a description will be given to a different point generated because the diode D1 is used as the switching element S1 instead of the third transistor element T3.

First, the on state of the third transistor element T3 corresponds to the conducting state of the diode D1 in which a voltage difference between the second control terminal CIN2 and the intermediate node N2 is greater than a turn-on voltage of the diode D1, and the off state of the third transistor element T3 corresponds to the non-conducting state of the diode D1 in which the voltage difference between the second control terminal CIN2 and the intermediate node N2 is smaller than the turn-on voltage of the diode D1.

In the case of the second type memory cell MC2, the initialization voltage VME in the initialization operation is supplied from the second control terminal CIN2, but a voltage drop corresponding to the turn-on voltage is generated in the diode D1, so that the voltage provided by adding the turn-on voltage to the initialization operation VME is applied to the second word line GL in the selected row as the second initialization selected row voltage VRSE2, during the period of the initialization operation. In other words, the voltage provided by subtracting the turn-on voltage of the diode D1 from the second initialization selected row voltage VRSE2 is the initialization voltage VME. Meanwhile, the second initialization unselected row voltage VRUSE2 lower than a voltage provided by adding the turn-on voltage to a lower limit value of the voltage range that the intermediate node of each memory cell MC2 can take is applied to the second word line GL in the unselected row.

In the case of the second type memory cell MC2, the second writing row voltage VRW2 lower than the voltage provided by adding the turn-on voltage to the lower limit value of the voltage range that the intermediate node of each memory cell MC2 can take is applied to the second word lines GL in all of the rows, during the period of the writing operation.

In the reading operation, in the case of the first type memory cell MC1, the reading power supply voltage VSR is supplied to the first fixed voltage line V1L or the second fixed voltage line V2L, the second reading selected row voltage VRSR2 is applied to the second word line GL in the selected row, and the reading current Ir is supplied to the first transistor element T1 through the third transistor element T3, while in the case of the second type memory cell MC2, instead of the above, only by applying the second reading selected row voltage VRSR2 to the second word line GL in the selected row, the diode D1 is set to the conducting state, and the reading current Ir is supplied to the first transistor element T1. Therefore, it is necessary to set the second reading selected row voltage VRSR2 to be sufficiently high so that the voltage of the intermediate node N2 when the maximum reading current Ir (=IDS1 (3)) flows to the diode D1 can operate the first transistor element T3 in the saturation region. In addition, the second reading unselected row voltage VRUSR2 lower than the voltage provided by adding the turn-on voltage to the lower limit value of the voltage range that the intermediate node of each memory cell MC2 can take is applied to the second word ling GL in the unselected row.

Other Embodiments

Hereinafter, other embodiments will be described.

<1> It has been assumed that the voltage state of the memory node N1 initialized by the initialization operation is allocated to the one data value "3" among the four-value data in the second to fourth embodiments, but in a case where one of the four data values "0" to "3" is not allocated to the initialized voltage state, the initialization voltage VME is set to be higher than the four memory voltages VM0 to VM3 corresponding to the data values "0" to "3" as shown in the following formula 8, so that the above-described initialization operation, writing operation, and reading operation can be executed in the same manner. In addition, in a case where the data value "3" is written in the writing operation, the writing voltage VW3 corresponding to the memory voltage VM3 is applied to the data line DL instead of the wring inhibition voltage VIW (initialization voltage VME or higher).

$$VM0<VM1<VM2<VM3<VME \quad \text{(Formula 8)}$$

In addition, a relationship between the writing voltages VW0 to VW3 and the writing inhibition voltage VIW is set to satisfy a relationship shown in the following formula 9 so that the relationship between the memory voltages VM0 to VM3 and the initialization voltage VME satisfies the relationship shown in the formula 8.

$$VW0<VW1<VW2<VW3<VIW \quad \text{(Formula 9)}$$

Furthermore, in the second to fourth embodiments, the description has been given assuming that one of the 2-bit four-value data (0 to 3) is written in or read from the memory cell MC, but the data stored in the memory cell MC is not limited to the four-value data, and may be two-value, three-value, five-value, or more data.

<2> In the second embodiment, the detailed description has been given to the case where the initialization operation is performed for the one selected row and then the writing operation is performed by sequentially selecting the data lines DL therein, but as another configuration, the initialization operation may be performed for all of the memory cells MC in the memory cell array MA by the one or more rows, or for all of the rows together, and then the writing operation may be performed by selecting an arbitrary memory cell MC in the memory cell array MA.

<3> In the second embodiment, the case where the initialization operation is performed by the row has been described, but as for the circuit configuration of the memory cell MC, the switching element S1 may be formed of a series circuit of the two third transistor elements T3 or a series circuit of the third transistor element T3 and the diode element D1 as shown in FIGS. 12A-12D instead of the single third transistor element T3 or the single diode element D1. Thus, one element is turned on/off by the second word line GL extending in the row direction, and the other element is turned on/off by a column select line CSL extending in the column direction, so that conduction/non-conduction of the switching element S1 can be controlled by the memory cell MC. As a result, the initialization operation can be also executed by the memory cell. Furthermore, when the initialization operation performed by the memory cell and the writing operation performed by the memory cell are sequentially executed, the data writing operation can be performed by the memory cell by selecting the one memory cell MC.

<4> Furthermore, as a method of executing the initialization operation by the memory cell, the first type memory cell MC1 shown in FIG. 1A is used as the memory cell MC, the memory cell MC1 has the configuration in which it includes the second voltage terminal VIN2 and the second voltage terminal VIN2 is connected to the second fixed voltage line V2L, the second word line GL is changed so as to extend in the column direction instead of the row direction and is arranged with respect to each column, and first voltage control lines V1L (V1L1 to V1Ln) are provided instead of the first fixed voltage line V1L and each of them is arranged with respect to each row so as to extend in the row direction.

In the above configuration, the first selected row voltage VRSL1 is applied to the first word line WL in the selected row having the memory cell MC1 serving as the initialization operation target to turn on the second transistor element T2 of the memory cell MC1 in the selected row, and the second initialization selected row voltage VRSE2 is applied to the second word line GL in the selected column having the memory cell MC1 serving as the initialization operation target to turn on the third transistor element T3 of the memory cell MC1 in the selected column. Thus, the second transistor element T2 and the third transistor element T3 of the memory cell MC1 positioned in the selected row and the selected column and serving as the initialization operation target are turned on at the same time, so that the initialization operation can be executed by the memory cell.

<4> Furthermore, the writing operation in the above configuration can be executed in the same manner as the writing operation described in the second embodiment by applying the second writing row voltage VRW2 set on the same basis as the second initialization unselected row voltage VRUSE2, to the second word lines GL in all of the columns because the third transistor elements T3 are in the off state in all of the memory cells MC1.

As a result, when the initialization operation performed by the memory cell and the writing operation performed by the memory cell are sequentially executed, the data writing operation can be performed by the memory cell by selecting an arbitrary memory cell MC.

In addition, the reading operation in the above configuration is different from the reading operation described in the second to fourth embodiments. According to the configuration in this other embodiment, since the second word line GL is arranged in each column, the same voltage (third reading selected row voltage) as the voltage applied at the time of the initialization operation and the writing operation is applied to the first voltage control line V1L in the selected row having the memory cell MC1 serving as the initialization operation target, and a third reading unselected row voltage VRUR3 lower than a third reading selected row voltage VRSR3 is supplied to the first voltage control line V1L in the unselected row. As a result, in the memory cell MC1 in the unselected row, a voltage drop of $-\Delta VN1$ ($=-\Delta VIN1 \times C1/CN1$) which is provided by multiplying a voltage change $\Delta VIN1$ ($=VRSR3-VRUR3$) in the first voltage terminal VIN1 by a capacity ratio C1/CN1 is generated through the capacitive element C1. However, CN1 represents a total capacity parasitic in the memory node and includes the capacity C1 of the capacitive element C1. When an absolute value ($\Delta VN1$) of the voltage drop is set so as to be equal to or higher than the initialization voltage VME, the first transistor element T1 of the memory cell MC1 in the unselected row is turned off regardless of the data stored in the memory node N1.

Meanwhile, a second reading selected column voltage VCSR2 is applied to the second word line GL in the selected column having the memory cell MC1 serving as the reading operation target to turn on the third transistor element T3 of the memory cell MC1 in the selected column, while a second reading unselected column voltage VCUR2 is applied to the second word line GL in the unselected column to turn off the third transistor element T3 of the memory cell MC1 in the unselected column. As a result, the third transistor element T3 of the memory cell MC1 positioned in the selected row and the selected column and serving as the reading operation target is turned on, and the first transistor element T1 can be turned on based on the memory data, so that the reading operation can be executed by the memory cell.

Figure 13:
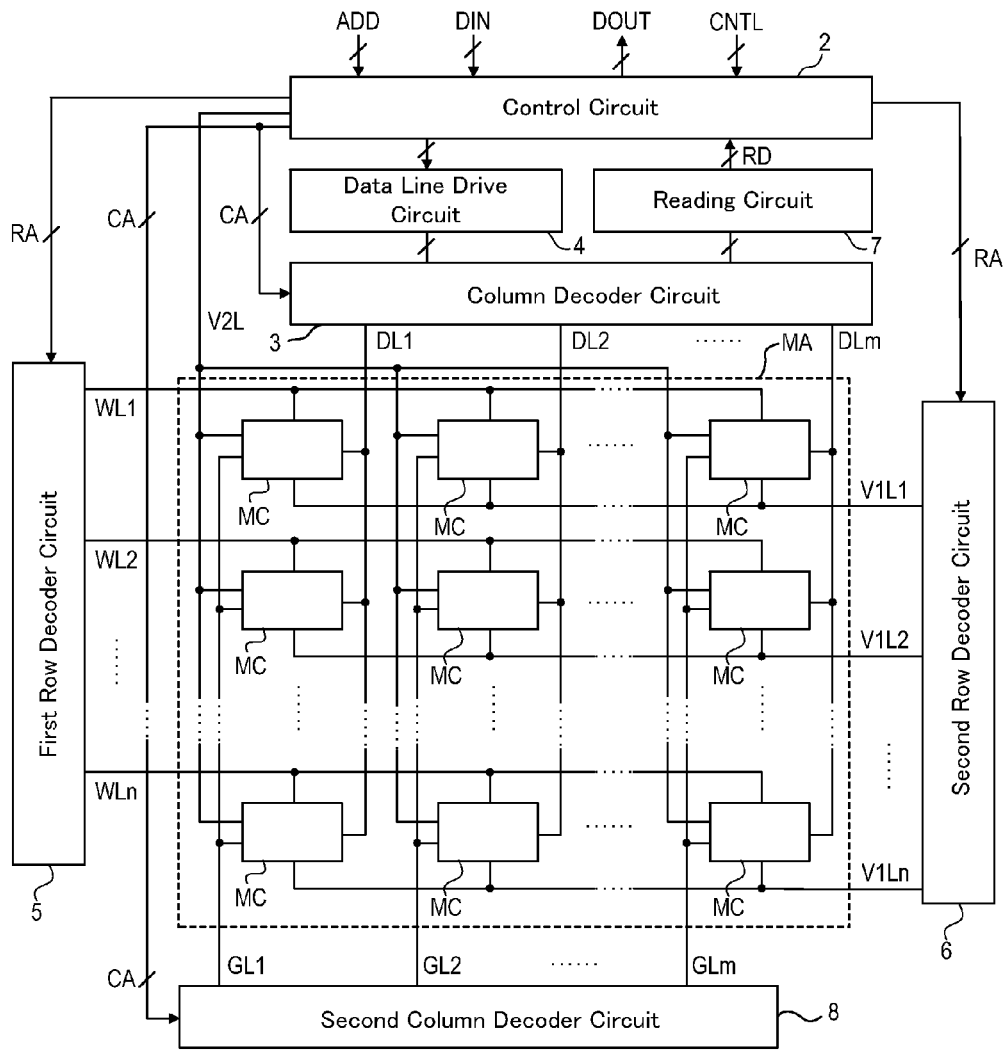
FIG. 13 is a block diagram showing another example of a schematic configuration of the semiconductor memory device according to the present invention.

However, according to this other embodiment, as shown in FIG. 13, the second row decoder circuit 6 needs to drive the first voltage control line V1L by the row, instead of the second word line GL in the reading operation, and it is necessary to separately provide a second column decoder circuit 8 which drives the second word line GL by the column, in the initialization operation and the reading operation. In addition, according to the configuration of this other embodiment, the reading circuit 7 may have any circuit configuration described in the second to fourth embodiments and following other embodiments <5> to <7>.

<5> As for the reading operation in the case where the reading circuit 7 is the voltage detection type sense amplifier as described in the second embodiment, the preliminary drive operation to drive the data line DL1 in the selected column (first column) at the reading column voltage VCR equal to or lower than the lowest writing voltage VW0 is performed at the times t6 to t7 in the timing chart shown in FIG. 9, but instead of the preliminary drive operation, during at least the period of times t7 to t9, a constant current circuit or a load circuit may be provided between the data line DL1 and a fixed voltage lower than the writing voltage VW0, and the voltage of the data line DL1 may be changed so that a constant current flowing in the constant current circuit or a load current flowing in the load circuit is balanced with the reading current Ir flowing in the first transistor element T1 based on the memory voltages VM0 to VM2 retained in the memory node N1, and the initialization voltage VME (=VM3).

For example, in the case where the constant current circuit is provided, when the constant current flowing in the constant current circuit is set at a reference current Iref shown in the following formula 10, and the drain currents IDS1 (0 to 3) flowing when the first transistor element T1 is operated in the saturation region are balanced with the reference current Iref as shown in following formula 11 to formula 14, respectively, the voltages (source voltages) VDL1 (0 to 3) of the data line DL1 are changed as shown in following formula 15 to formula 18, respectively based on the memory data.

$$Iref = \beta \times (VM0 - Vref - Vt1)^2 / 2 \quad \text{(Formula 10)}$$
$$= \beta \times (VW0 - Vref)^2 / 2$$

$$IDS1(0) = \beta \times (VM0 - VDL1(0) - Vt1)^2 / 2 \quad \text{(Formula 11)}$$
$$= \beta \times (VW0 - VDL1(0))^2 / 2$$
$$= \beta \times (VW0 - Vref)^2 / 2$$

$$IDS1(1) = \beta \times (VM1 - VDL1(1) - Vt1)^2 / 2 \quad \text{(Formula 12)}$$
$$= \beta \times (VW1 - VDL1(1))^2 / 2$$
$$= \beta \times (VW0 - Vref)^2 / 2$$

$$IDS1(2) = \beta \times (VM2 - VDL1(2) - Vt1)^2 / 2 \quad \text{(Formula 13)}$$
$$= \beta \times (VW2 - VDL1(2))^2 / 2$$
$$= \beta \times (VW0 - Vref)^2 / 2$$

$$IDS1(3) = \beta \times (VME - VDL1(3) - Vt1)^2 / 2 \quad \text{(Formula 14)}$$
$$= \beta \times (VW0 - Vref)^2 / 2$$

$$VDL1(0) = Vref \quad \text{(Formula 15)}$$

$$VDL1(1) = Vref + (VW1 - VW0) \quad \text{(Formula 16)}$$

$$VDL1(2) = Vref + (VW2 - VW0) \quad \text{(Formula 17)}$$

$$VDL1(3) = Vref + (VME - Vt1 - VW0) \quad \text{(Formula 18)}$$

Therefore, after the voltages (source voltage) VDL1 (0 to 3) of the data line DL1 are changed to the voltages shown in the above formula 15 to formula 18 or their vicinities, one of the memory data "0" to "3" to which the voltage level of the data line DL1 corresponds can be read by detection of the voltage level of the data line DL1 selected by the column decoder circuit 3, and inputted to the voltage detection type sense amplifier (reading circuit 7).

Furthermore, in the case where the load circuit is provided between the data line DL1 and the fixed voltage also, when the load current flowing in the load circuit is balanced with the drain currents IDS1 (0 to 3) provided when the first transistor element T1 is operated in the saturation region, the voltages (source voltages) VDL1 (0 to 3) of the data line DL1 are changed based on the memory data, so that after the voltages are changed, one of the memory data "0" to "3" to which the voltage level of the data line DL1 corresponds can be read by detecting the voltage level of the data line DL1 selected by the column decoder circuit 3 and inputted to the voltage detection type sense amplifier (reading circuit 7).

Figure 14:
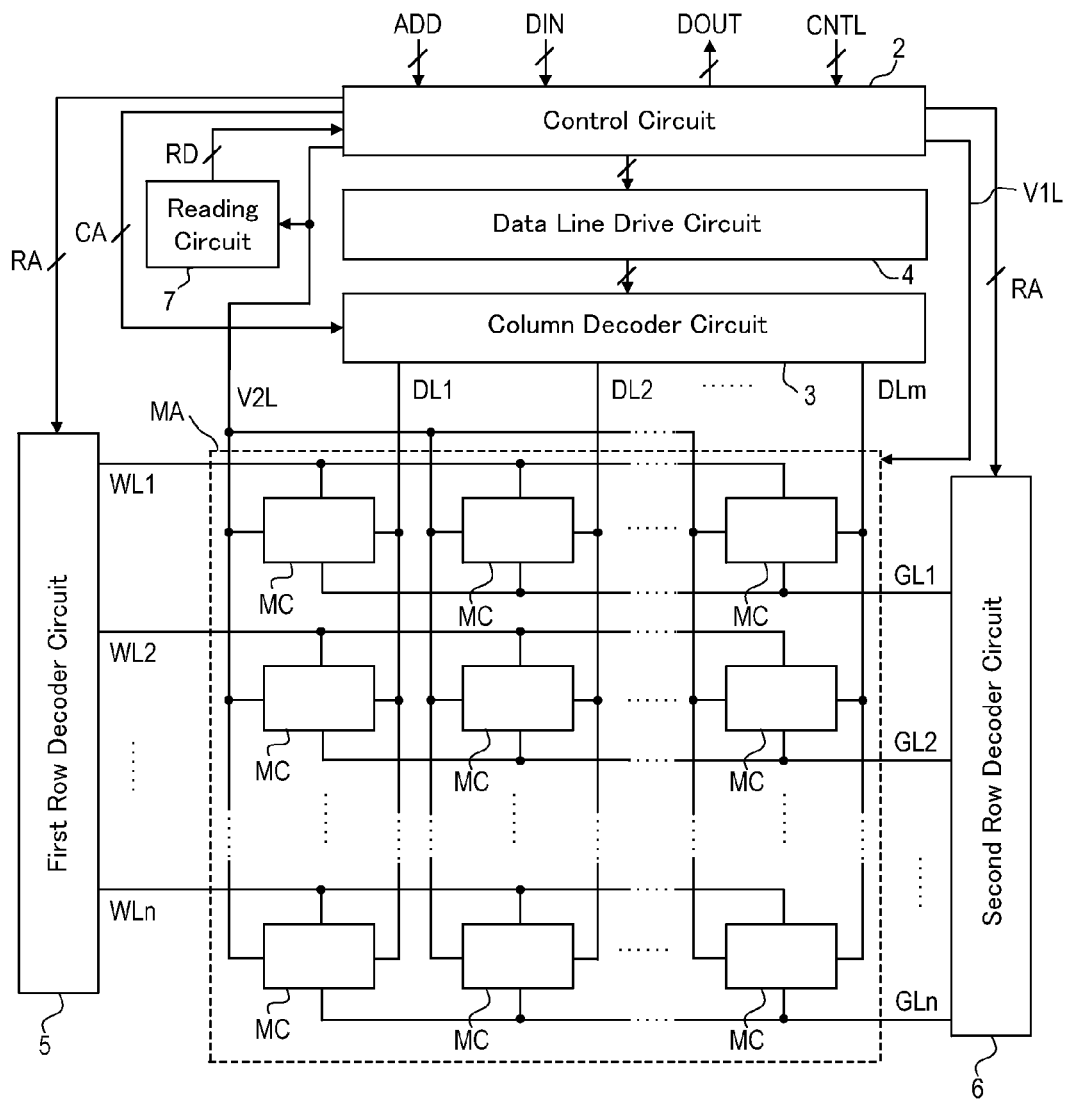
FIG. 14 is a block chart showing another example in a case where a reading circuit is the current detection type sense amplifier in the schematic configuration of the semiconductor memory device according to the present invention.
Figure 15:
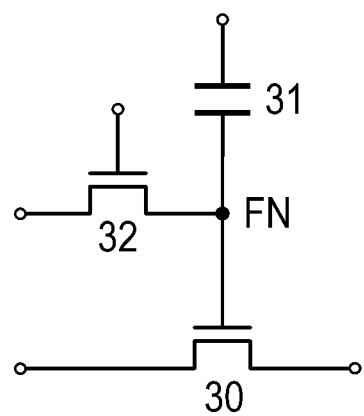
FIG. 15 is an equivalent circuit diagram showing one example of a conventional semiconductor memory circuit including an oxide semiconductor insulated gate FET.

<6> It is assumed that the reading circuit 7 has the circuit configuration in which the reading circuit 7 is connected to the data line DL1 through the column decoder circuit 3 in the second to fourth embodiments, but in the case where the reading circuit 7 is the current detection type sense amplifier, and in the case where the memory cell MC is the first type memory cell MC1 shown in FIG. 1A, and the memory cell MC1 includes the second voltage terminal VIN2, the circuit configuration may be provided such that the current detection type sense amplifier is connected to the second fixed voltage line V2L as shown in FIG. 14. In this case, the memory cell array MA is divided into the same number of blocks as the number of the memory cells MC which are read at the same time, the second fixed voltage line V2L is provided with respect to each block, and the second voltage terminal VIN2 of the memory cell MC in the same block is connected to the common second fixed voltage line V2L.

<7> The description has been given to the case where the reading circuit 7 is the voltage detection type sense amplifier or the current detection type sense amplifier in the second to fourth embodiments and the other embodiments, but as another configuration, the reading circuit 7 may covert a current detected by the current detection type sense amplifier to a voltage, and the voltage detection type sense amplifier may detect the converted voltage.

<8> The description has been given assuming that the first transistor element T1 composing the memory cell MC is the n-channel thin film transistor in the above embodiments, but the first transistor element T1 may be a p-channel insulated gate FET. Note that in the case where the first transistor element T1 is the p-channel type, the directions of the initialization current Ie, the writing current Iw, the reading current Ir are opposite to the directions of the currents described in the above embodiments. Consequently, the direction of the inequality signs in each of the formula 1, formula 2, formula 7, formula 8, and formula 9 is to be reversed. The basic ideas of the initialization operation, the writing operation, and the reading operation are the same as in the case of the n-channel type except that the directions of the currents in each operation are reversed, so that its detailed description is omitted. In addition, in the case where the memory cell MC is the second type memory cell MC2 shown in FIGS. 1B and 1C, the anode electrode of the diode D1 needs to be provided beside the intermediate node N2.

Furthermore, other than the first transistor element T1, the second and third transistor elements T2 and T3 may be composed of the p-channel insulated gate FET. In addition, in the case of the second type memory cell MC2, when the diode D1 is composed of the fourth transistor element T4, the fourth transistor element T4 may be composed of the p-channel insulated gate FET. Furthermore, the first to fourth transistor elements T1 to T4 are not limited to the thin film transistor.

EXPLANATION OF REFERENCES

1 Memory device (semiconductor memory device)
2 Control circuit

3 Column decoder circuit
4 Data line drive circuit
5 First row decoder circuit
6 Second row decoder circuit
7 Reading circuit
ADD Address signal
CA Column address signal
CIN1 First control terminal
CIN2 Second control terminal
CNTL Control signal
CSL Column select line
C1 Capacitive element
DIN Data input signal
DIO Data I/O terminal
DL (DL1, DL2, . . . , DLm) Data line (data signal line)
DOUT Data output signal
D1 Diode (switching element)
GL (GL1, GL2, . . . , GLn) Second word line (second control signal line)
MA, MA1, MA2 Memory cell array
MC, MC1, MC2 Memory cell (semiconductor memory circuit)
N1 Memory node
N2 Intermediate node
RA Row address signal
RD Detected information
S1 Switching element
T1 First transistor element
T2 Second transistor element
T3 Third transistor element (switching element)
T4 Fourth transistor element (switching element)
VIN1 First voltage terminal
VIN2 Second voltage terminal
V1L First fixed voltage line
V1L (V1L1, V1L2, . . . , V1Ln) First voltage control line
V2L Second fixed voltage line
WL (WL1, WL2, . . . , WLn) First word line (first control signal line)

The invention claimed is:

1. A semiconductor memory circuit comprising:
a first transistor element composed of an insulated gate FET having a gate electrode connected to a memory node, a drain electrode connected to an intermediate node, and a source electrode connected to a data I/O terminal;
a second transistor element composed of an oxide semiconductor insulated gate FET having a gate electrode connected to a first control terminal, a drain electrode connected to the intermediate node, and a source electrode connected to the memory node;
a capacitive element having one end connected to a first voltage terminal, and the other end connected to the memory node; and
a switching element for controlling a conducting state between one of a second control terminal, a second voltage terminal, and the first voltage terminal, and the intermediate node, based on a voltage level of at least the second control terminal; wherein,
the switching element is one of: a third transistor element composed of an insulated gate FET having a gate electrode connected to the second control terminal, a drain electrode connected to one of the second voltage terminal and the first voltage terminal, and a source electrode connected to the intermediate node; a fourth transistor element composed of an insulated gate FET having a gate electrode and a drain electrode each connected to the second control terminal, and a source electrode connected to the intermediate node; and a diode element in which one of an anode terminal and a cathode terminal is connected to the second control terminal, and the other is connected to the intermediate node.

2. The semiconductor memory circuit according to claim 1, wherein
each of the first to fourth transistor elements is a thin film transistor element.

3. The semiconductor memory circuit according to claim 1, wherein
an oxide semiconductor forming the second transistor element is InGaZnO.

4. The semiconductor memory circuit according to claim 1, wherein
in a writing operation, the second transistor element is turned on and the switching element is set to a non-conducting state, based on each of voltage levels of the first control terminal and the second control terminal, and a memory voltage having a constant relationship with a writing voltage inputted to the data I/O terminal is written in the memory node.

5. The semiconductor memory circuit according to claim 4, wherein
in an initialization operation prior to the writing operation, the second transistor element is turned on and the switching element is set to a conducting state, based on each of the voltage levels of the first control terminal and the second control terminal, and a voltage level of the memory node is initialized.

6. The semiconductor memory circuit according to claim 4, wherein
after the writing operation, the second transistor element is turned off and the memory node is set to a floating state, based on the voltage level of the first control terminal, and the memory voltage stored in the memory node is kept retained.

7. The semiconductor memory circuit according to claim 1, wherein
in a reading operation, the second transistor element is turned off based on the voltage level of the first control terminal and a reading control voltage is applied to the second control terminal, and one of a reading voltage and a reading current corresponding to the memory voltage stored in the memory node is outputted to the data I/O terminal.

8. A semiconductor memory device comprising:
a memory cell array in which a plurality of memory cells are arranged in each of a row direction and a column direction, each of the memory cells configured by the semiconductor memory circuit according to claim 1, wherein
the first control terminal of the semiconductor memory circuit arranged in the same row is connected to a common first control signal line,
the second control terminal of the semiconductor memory circuit arranged in the same row is connected to a common second control signal line,
the data I/O terminal of the semiconductor memory circuit arranged in the same column is connected to a common data signal line, and
the first voltage terminal of the semiconductor memory circuit arranged in the same row or the same column is connected to a common fixed voltage line.

9. The semiconductor memory device according to claim 8, comprising:
a data signal line drive circuit for driving the data signal line individually;

a first control signal line drive circuit for driving the first control signal line individually;
a second control signal line drive circuit for driving the second control signal line individually; and
a reading circuit for detecting one of a reading voltage and a reading current outputted to the data signal line based on the memory voltage stored in the memory node.

10. The semiconductor memory device according to claim 9, wherein
in a writing operation, the data signal line drive circuit individually applies a writing voltage based on data to be stored, to the data signal line in a selected column serving as a writing target, and individually applies a writing inhibition voltage to the data signal line in an unselected column serving as a non-writing target to turn off the first transistor element in a case where the second transistor element is in an on state, in the semiconductor memory circuit arranged in the unselected column.

11. The semiconductor memory device according to claim 9, wherein
in a writing operation and an initialization operation performed prior to the writing operation, the first control signal line drive circuit applies a first selected row voltage to the first control signal line in a selected row serving as an operation target to turn on the second transistor element, and applies a first unselected row voltage to the first control signal line in an unselected row serving as a non-operation target to turn off the second transistor element, and
in a reading operation, the first control signal line drive circuit applies a first reading row voltage to the first control signal lines in all of the rows to turn off the second transistor element.

12. The semiconductor memory device according to claim 9, wherein
in a writing operation, the second control signal line drive circuit applies a second writing row voltage to the second control signal lines in all of the rows to set the switching element to a non-conducting state,
in an initialization operation prior to the writing operation, the second control signal line drive circuit applies a second initialization selected row voltage to the second control signal line in at least the selected row serving as the operation target to set the switching element to a conducting state, and in a reading operation, the second control signal line drive circuit applies a second reading selected row voltage to the second control signal line in the selected row serving as the operation target to set the switching element to the conducting state, and applies a second reading unselected row voltage to the second control signal line in the unselected row serving as the non-operation target to set the switching element to the non-conducting state.

13. A semiconductor memory device comprising:
a memory cell array in which a plurality of memory cells are arranged in each of a row direction and a column direction, each of the memory cells configured by the semiconductor memory circuit according to claim 1, wherein
the first control terminal of the semiconductor memory circuit arranged in the same row is connected to a common first control signal line,
the second control terminal of the semiconductor memory circuit arranged in the same column is connected to a common second control signal line,
the data I/O terminal of the semiconductor memory circuit arranged in the same column is connected to a common data signal line,
the first voltage terminal of the semiconductor memory circuit arranged in the same row is connected to a common first voltage control line, and
the switching element of the semiconductor memory circuit is a third transistor element composed of an insulated gate FET having a gate electrode connected to the second control terminal, a drain electrode connected to the second voltage terminal, and a source electrode connected to the intermediate node.

14. The semiconductor memory device according to claim 13, comprising:
a data signal line drive circuit for driving the data signal line individually;
a first control signal line drive circuit for driving the first control signal line individually;
a second control signal line drive circuit for driving the second control signal line individually;
a first voltage control line drive circuit for driving the first voltage control line individually, and
a reading circuit for detecting one of a reading voltage and a reading current outputted to the data signal line based on the memory voltage stored in the memory node.

* * * * *